United States Patent
Amano et al.

(10) Patent No.: US 11,776,824 B2
(45) Date of Patent: Oct. 3, 2023

(54) PROCESSING LIQUID EJECTION NOZZLE, NOZZLE ARM, SUBSTRATE PROCESSING APPARATUS, AND SUBSTRATE PROCESSING METHOD

(71) Applicant: Tokyo Electron Limited, Tokyo (JP)

(72) Inventors: Yoshifumi Amano, Kumamoto (JP); Kazuhiro Aiura, Kumamoto (JP); Tatsuhiro Ueki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 423 days.

(21) Appl. No.: 16/925,369

(22) Filed: Jul. 10, 2020

(65) Prior Publication Data
US 2021/0020463 A1    Jan. 21, 2021

(30) Foreign Application Priority Data

Jul. 16, 2019 (JP) .................................. 2019-131192
May 28, 2020 (JP) .................................. 2020-093773

(51) Int. Cl.
*H01L 21/67*    (2006.01)
*H01L 21/306*    (2006.01)

(52) U.S. Cl.
CPC .... *H01L 21/6708* (2013.01); *H01L 21/30604* (2013.01); *H01L 21/67051* (2013.01)

(58) Field of Classification Search
CPC ........... H01L 21/6708; H01L 21/67051; H01L 21/30604
See application file for complete search history.

(56) References Cited

U.S. PATENT DOCUMENTS

| 4,310,567 | A  | * | 1/1982 | Tabata | C23C 16/455 |
| | | | | | 427/166 |
| 6,453,916 | B1 | * | 9/2002 | Tran | G03F 7/162 |
| | | | | | 134/144 |
| 2002/0035762 | A1 | * | 3/2002 | Okuda | B08B 3/02 |
| | | | | | 134/102.1 |
| 2002/0170579 | A1 | * | 11/2002 | Lammert | B08B 3/024 |
| | | | | | 134/102.1 |
| 2003/0119424 | A1 | * | 6/2003 | Ahmadi | H01L 21/67051 |
| | | | | | 451/39 |
| 2004/0018803 | A1 | * | 1/2004 | Boumerzoug | B24C 1/003 |
| | | | | | 451/39 |
| 2010/0029088 | A1 | * | 2/2010 | Mayer | C25F 3/12 |
| | | | | | 438/748 |

(Continued)

FOREIGN PATENT DOCUMENTS

JP        2019-040958 A    3/2019

*Primary Examiner* — Benjamin L Osterhout
(74) *Attorney, Agent, or Firm* — Venjuris, P.C.

(57) ABSTRACT

A processing liquid ejection nozzle ejects a processing liquid used for a substrate processing. The processing liquid ejection nozzle includes a nozzle main body and an angle changing mechanism. The nozzle main body includes a first main body formed with a first flow path therein which communicates with a processing liquid supply path, and a second main body bent from the first main body and formed with a second flow path therein which communicates with the first flow path. The angle changing mechanism changes an angle of the nozzle main body in a horizontal direction with respect to a fixing member to which the nozzle main body is fixed.

22 Claims, 20 Drawing Sheets

(56) References Cited

U.S. PATENT DOCUMENTS

| | | | | |
|---|---|---|---|---|
| 2011/0286738 A1* | 11/2011 | Noda | ............... | H01L 21/67253 |
| | | | | 396/611 |
| 2012/0247670 A1* | 10/2012 | Dobashi | ............ | H01L 21/67028 |
| | | | | 156/345.31 |
| 2013/0152976 A1* | 6/2013 | Amano | ..................... | B08B 3/04 |
| | | | | 134/94.1 |
| 2013/0156948 A1* | 6/2013 | Amano | ............. | H01L 21/67051 |
| | | | | 118/52 |
| 2014/0261569 A1* | 9/2014 | Fonseca | ............ | H01L 21/67051 |
| | | | | 134/30 |
| 2015/0190821 A1* | 7/2015 | Pahl | ........................ | B05B 3/026 |
| | | | | 118/300 |

* cited by examiner

PROCESSING LIQUID EJECTION NOZZLE, NOZZLE ARM, SUBSTRATE PROCESSING APPARATUS, AND SUBSTRATE PROCESSING METHOD

CROSS-REFERENCE TO RELATED APPLICATIONS

This application is based on and claims priority from Japanese Patent Application Nos. 2019-131192 and 2020-093773 filed on Jul. 16, 2019 and May 28, 2020, respectively, with the Japan Patent Office, the disclosures of which are incorporated herein in their entireties by reference.

TECHNICAL FIELD

The present disclosure relates to a processing liquid ejection nozzle, a nozzle arm, a substrate processing apparatus, and a substrate processing method.

BACKGROUND

Japanese Patent Laid-Open Publication No. 2019-040958 discloses ejecting a processing liquid from a processing liquid nozzle toward a substrate.

SUMMARY

According to an aspect of the present disclosure, a processing liquid ejection nozzle is a nozzle that ejects a processing liquid used for a substrate processing. The processing liquid ejection nozzle includes a nozzle main body and an angle changing mechanism. The nozzle main body includes a first main body formed with a first flow path therein which communicates with a processing liquid supply path, and a second main body bent from the first main body and formed with a second flow path therein which communicates with the first flow path. The angle changing mechanism changes an angle of the nozzle main body in a horizontal direction with respect to a fixing member to which the nozzle main body is fixed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a processing liquid ejection nozzle, a nozzle arm, a substrate processing apparatus, and a substrate processing method according to the present disclosure will be described in detail with reference to the accompanying drawings. The processing liquid ejection nozzle, the nozzle arm, the substrate processing apparatus, and the substrate processing method according to the present disclosure are not limited to the embodiments.

In each drawing to be referred to herein below, an orthogonal coordinate system may be represented in which an X-axis direction, a Y-axis direction, and a Z-axis direction are defined to be orthogonal to each other, and the Z-axis positive direction is a vertically upward direction, in order to facilitate the understanding of descriptions. The X-axis direction and the Y-axis direction are horizontal directions.

In the following, the Z-axis positive direction may be referred to as an upper side and the Z-axis negative direction may be referred to as a lower side.

First Embodiment

<Entire Configuration of Substrate Processing Apparatus>

Figure 1:
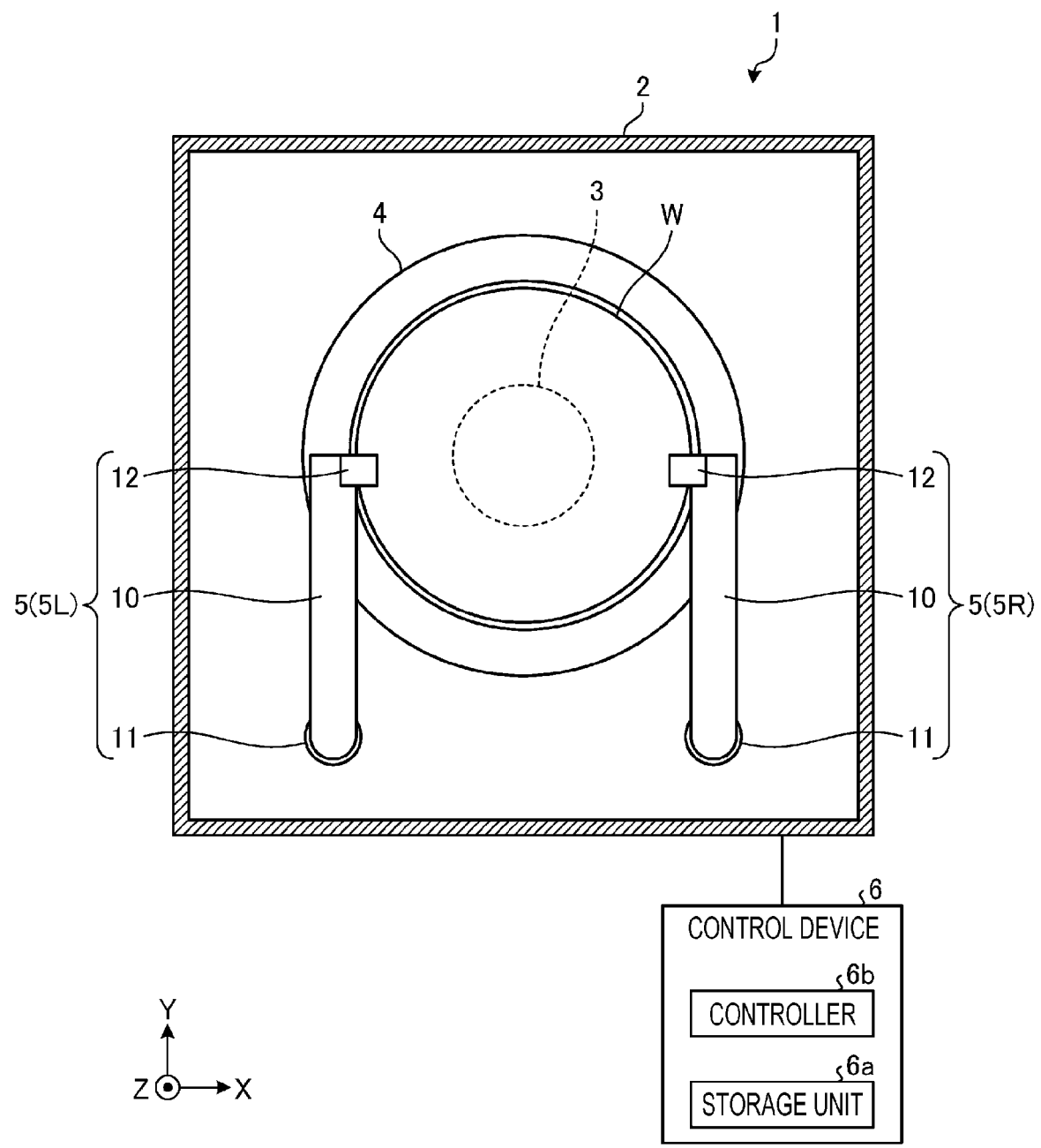
FIG. 1 is a schematic view illustrating a configuration of a substrate processing apparatus according to a first embodiment.

A configuration of a substrate processing apparatus 1 according to a first embodiment will be described with reference to FIG. 1. FIG. 1 is a schematic view illustrating the configuration of the substrate processing apparatus 1 according to the first embodiment.

The substrate processing apparatus 1 includes a processing container 2, a holder 3, an outer cup 4, an arm 5, and a control device 6. The processing container 2 accommodates the holder 3, the outer cup 4, and the arm 5 therein. The processing container 2 accommodates a processing liquid ejection nozzle 21 of the arm 5, and a movement mechanism 11 which will be described later.

The holder 3 holds a circular substrate W placed thereon. The holder 3 holds the substrate W when a substrate processing is performed. For example, the holder 3 holds the substrate W by adsorbing the lower surface of the substrate W using a vacuum chuck. Further, the holder 3 (an example of a substrate rotation unit) rotates the placed substrate W. Specifically, the holder 3 rotates around the axis along the Z-axis direction, thereby rotating the held substrate W.

Further, the holder 3 moves up and down in the Z-axis direction. For example, the holder 3 moves up and down in a state of holding the substrate W. The holder 3 moves the substrate W up and down between a transfer position and a processing position. The transfer position is a position above the outer cup 4, and is a position where the substrate W is transferred between the holder 3 and a substrate transfer device (not illustrated). The processing position is a position below the transfer position inside the outer cup 4, and is a position where a processing is performed on the substrate W.

The outer cup 4 (an example of a cup) is provided to surround the holder 3 and the outer periphery of the substrate W held on the holder 3. The outer cup 4 is provided in an annular shape.

The outer cup 4 receives a processing liquid scattered from the substrate W. The outer cup 4 is formed of a material having a high chemical resistance. A drain port (not illustrated) is provided at the bottom of the outer cup 4. The processing liquid received by the outer cup 4 is discharged to the outside of the processing container 2 through the drain port.

The processing liquid is, for example, a chemical liquid or a rinse liquid. The chemical liquid is, for example, hydrofluoric acid (HF), dilute hydrofluoric acid (DHF), hydrofluoric nitric acid or the like. The hydrofluoric nitric acid is a mixed solution of hydrofluoric acid (HF) and nitric acid ($HNO_3$). The rinse liquid is, for example, deionized water (DIW).

A pair of arms 5 is arranged along the X-axis direction. Specifically, the arms 5 are arranged on both sides of the substrate W in the X-axis direction. Hereinafter, of the pair of arms 5, the arm 5 disposed on the side of the X-axis negative direction may be referred to as a left arm 5L, and the arm 5 disposed on the side of the X-axis positive direction may be referred to as a right arm 5R. Each arm 5 includes an arm portion 10, a movement mechanism 11, and a processing liquid supply 12. One arm 5 may be provided.

The arm portion 10 extends from the base end thereof along the Z-axis direction, and extends horizontally from the upper end thereof. The arm portion 10 is provided in an L shape.

The movement mechanism 11 (an example of a pivoting mechanism) pivots the arm portion 10. Specifically, the movement mechanism 11 pivots the arm portion 10 around the axis of the arm portion 10 that extends in the Z-axis direction. Further, the movement mechanism 11 moves the arm portion 10 along the X-axis direction and the Z-axis direction. A plurality of movement mechanisms 11 may be provided. For example, the plurality of movement mechanisms 11 may include a movement mechanism that pivots the arm portion 10 around the axis of the arm portion 10 in the Z-axis direction, a movement mechanism that moves the arm portion 10 along the X-axis direction, and a movement mechanism that moves the arm portion 10 along the Z-axis direction.

The processing liquid supply 12 supplies the processing liquid to the upper surface of the substrate W. The processing liquid supply 12 ejects the processing liquid to the peripheral edge of the upper surface of the substrate W, to perform an etching processing on the peripheral edge of the substrate W. The processing liquid supply 12 is provided at the tip of the arm portion 10. Details of the processing liquid supply 12 will be described later.

The peripheral edge refers to a region including a radial inner portion of the substrate W that has a width of, for example, about 1 mm to 5 mm from the end surface of the circular substrate W. The peripheral edge is an annular region.

The substrate processing apparatus 1 may include, for example, a lower surface supply (not illustrated) that supplies the processing liquid to the peripheral edge of the lower surface of the substrate W, or a heating mechanism (not illustrated) that heats and supplies a fluid toward the lower surface of the substrate W.

The control device 6 is, for example, a computer and includes a storage unit 6a and a controller 6b.

The storage unit 6a is implemented by, for example, a semiconductor memory device such as a RAM or a flash memory, or a storage device such as a hard disk or an optical disk, and stores programs for controlling various processes executed in the substrate processing apparatus 1.

The controller 6b includes a micro-computer having a CPU (central processing unit), a ROM (read only memory), a RAM (random access memory), an input/output port and others, or various circuits. The controller 6b reads and executes the programs stored in the storage unit 6a, so as to control the operation of the substrate processing apparatus 1.

The programs may be recorded in a computer-readable recording medium, and installed from the recording medium to the storage unit 6a of the control device 6. The computer-readable recording medium may be, for example, a hard disk (HD), a flexible disk (FD), a compact disk (CD), a magnet optical disk (MO), or a memory card.

<Processing Liquid Supply>

Figure 2:
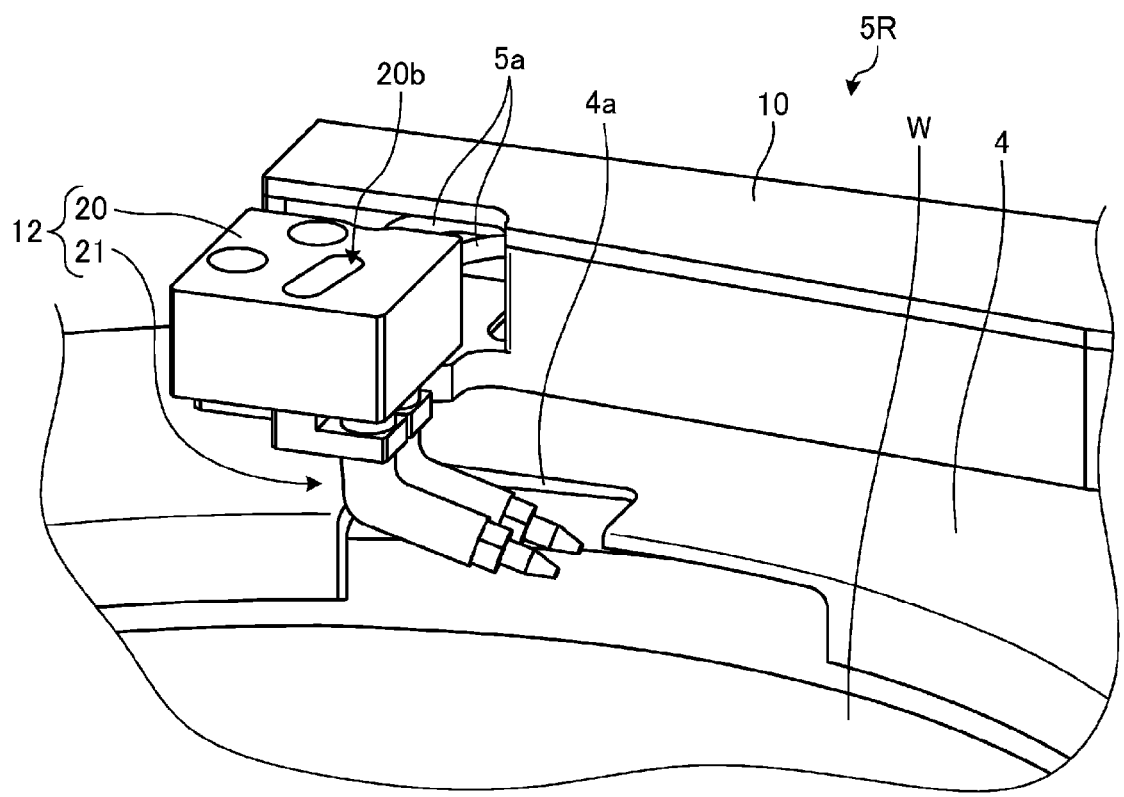
FIG. 2 is a perspective view of a processing liquid supply according to the first embodiment.
Figure 3:
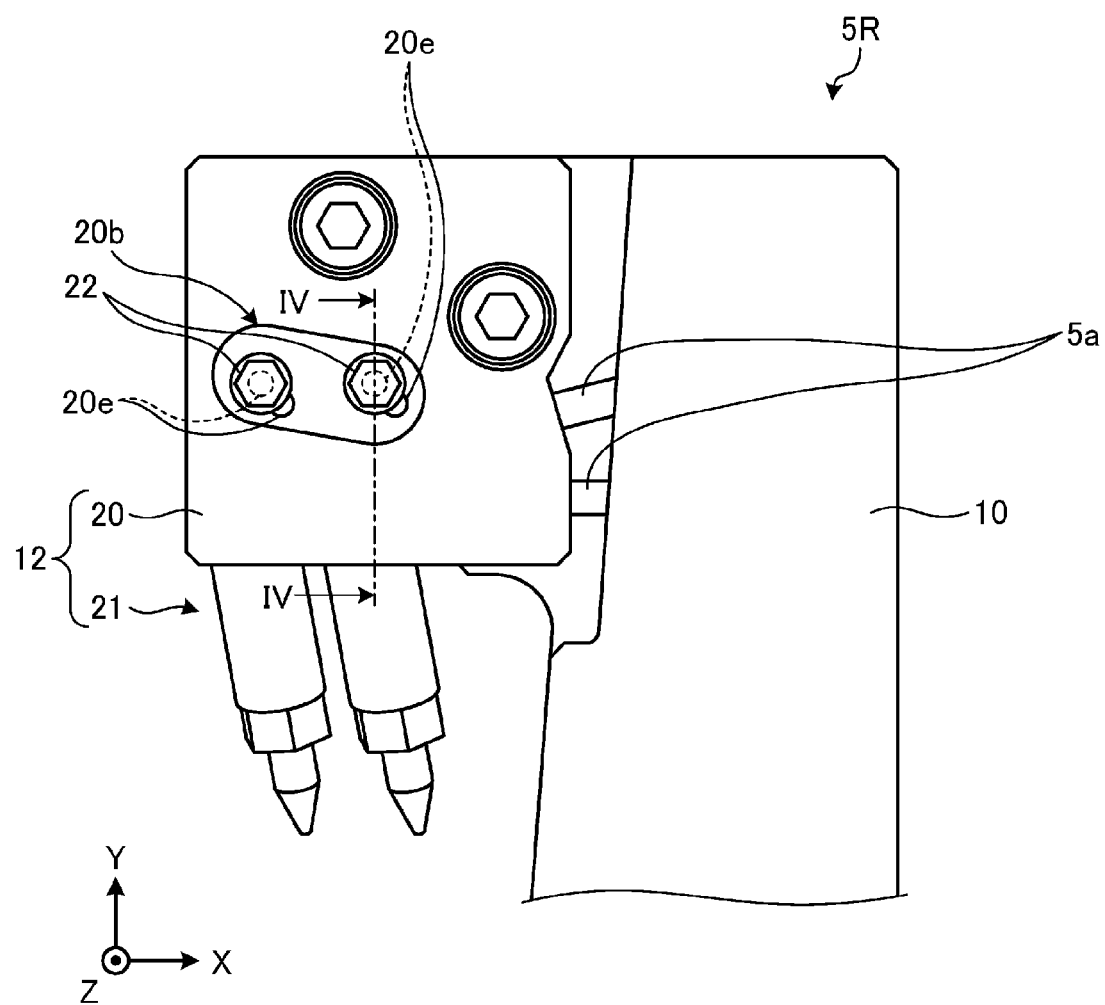
FIG. 3 is a plan view of the processing liquid supply according to the first embodiment.

Next, the processing liquid supply 12 will be described with reference to FIGS. 2 and 3. FIG. 2 is a perspective view of the processing liquid supply 12 according to the first embodiment. FIG. 3 is a plan view of the processing liquid supply 12 according to the first embodiment. The processing liquid supply 12 illustrated in each of FIGS. 2 and 3 corresponds to the processing liquid supply 12 provided in the right arm 5R.

Figure 4:
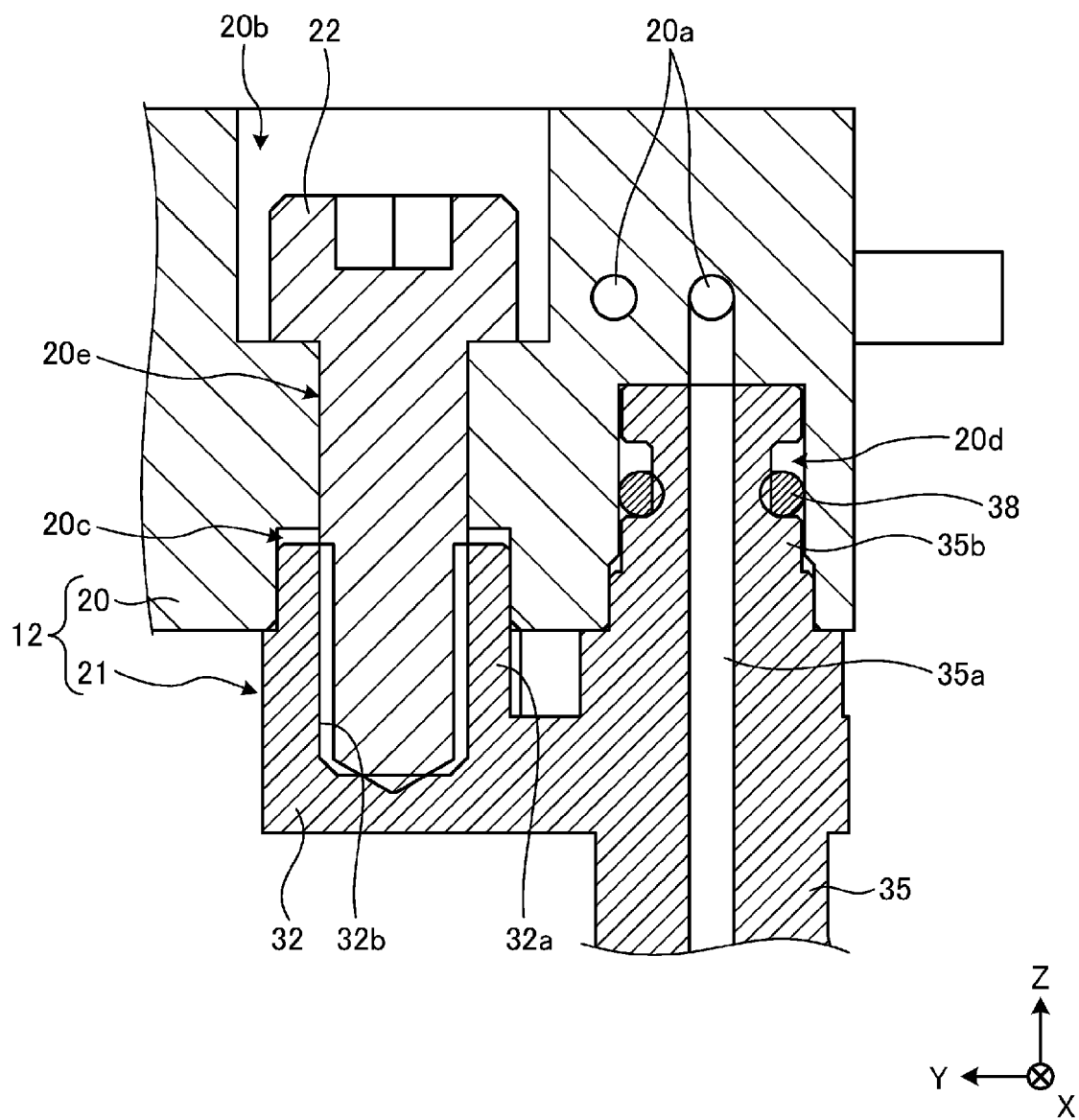
FIG. 4 is a cross-sectional view taken along the IV-IV line of FIG. 3.

The processing liquid supply 12 includes a nozzle block 20 and a processing liquid ejection nozzle 21. The nozzle block 20 is attached to the tip of the arm portion 10. That is, the nozzle block 20 (an example of a fixing member) is attached to the arm portion 10. A processing liquid supply tube 5a provided in the arm 5 is connected to the nozzle block 20. A processing liquid supply path 20a is formed in the nozzle block 20 as illustrated in FIG. 4. The processing liquid supplied from the processing liquid supply tube 5a flows through the processing liquid supply path 20a. FIG. 4 is a cross-sectional view taken along the IV-IV line of FIG. 3.

A first recess 20b, a second recess 20c, and a third recess 20d are formed in the nozzle block 20. The first recess 20b is formed to be recessed downward from the upper surface of the nozzle block 20. A through hole 20e is formed at the bottom of the first recess 20b. A bolt 22 is inserted through the through hole 20e to fix the processing liquid ejection nozzle 21 to the nozzle block 20.

As illustrated in FIG. 3, a plurality of through holes 20e is formed for one processing liquid ejection nozzle 21. For example, two through holes 20e are formed for one processing liquid ejection nozzle 21. The number of through holes 20e for one processing liquid ejection nozzle 21 is not limited to two. For example, the number of through holes 20e for one processing liquid ejection nozzle 21 may be three or more.

As illustrated in FIG. 4, the second recess 20c is formed to be recessed upward from the lower surface of the nozzle block 20. The second recess 20c is formed around the through hole 20e. The second recess 20c communicates with the first recess 20b through the through hole 20e. An attachment unit 32a of the processing liquid ejection nozzle 21 which will be described later is inserted into the second recess 20c.

The second recess 20c and the through hole 20e are formed such that the angle of the processing liquid ejection nozzle 21 is changeable in the horizontal direction with respect to the nozzle block 20. Specifically, a plurality of second recesses 20c is formed such that the attachment unit 32a of the processing liquid ejection nozzle 21 may be inserted into one of the second recesses 20c according to an attachment position of the processing liquid ejection nozzle 21. For example, two second recesses 20c may be provided for one processing liquid ejection nozzle 21. The two second recesses 20c may be formed to partially overlap with each other. That is, the two second recesses 20c may be formed to communicate with each other.

The through hole 20e is formed such that the angle of the processing liquid ejection nozzle 21 is changeable. Specifically, two through holes 20e that correspond to one processing liquid ejection nozzle 21 are formed to have central axes arranged on the same radius that coincides at the center with the central axis of an introduction portion 35b of the processing liquid ejection nozzle 21 which will be described later.

The third recess 20d is formed to be recessed upward from the lower surface of the nozzle block 20. The introduction portion 35b of the processing liquid ejection nozzle 21 that will be described later is inserted into the third recess 20d. The inner wall surface of the third recess 20d is formed in a circular shape.

The processing liquid ejection nozzle 21 moves between a standby position and an ejection position, according to the movement of the arm portion 10 by the movement mechanism 11. The standby position is a position where a portion of the processing liquid ejection nozzle 21 is accommodated in a notch 4a formed in the outer cup 4. The standby position is a position where the holder 3 may move the substrate W up and down between the transfer position and the processing position. When the processing liquid ejection nozzle 21 is at the standby position, the substrate W and the processing liquid ejection nozzle 21 are not in contact with each other by the upward/downward movement of the substrate W.

The ejection position is an inner position than the standby position in the radial direction of the substrate W. The ejection position is a position where the processing liquid ejection nozzle 21 ejects the processing liquid to the peripheral edge of the substrate W.

Figure 5:
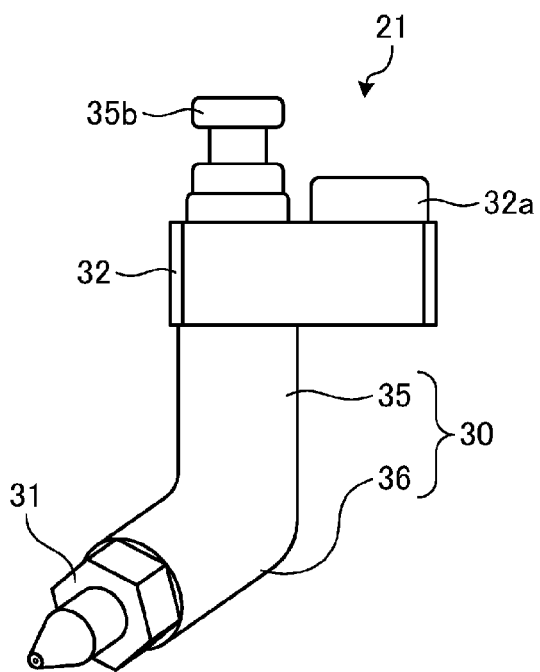
FIG. 5 is a front view of a processing liquid ejection nozzle according to the first embodiment.
Figure 6:
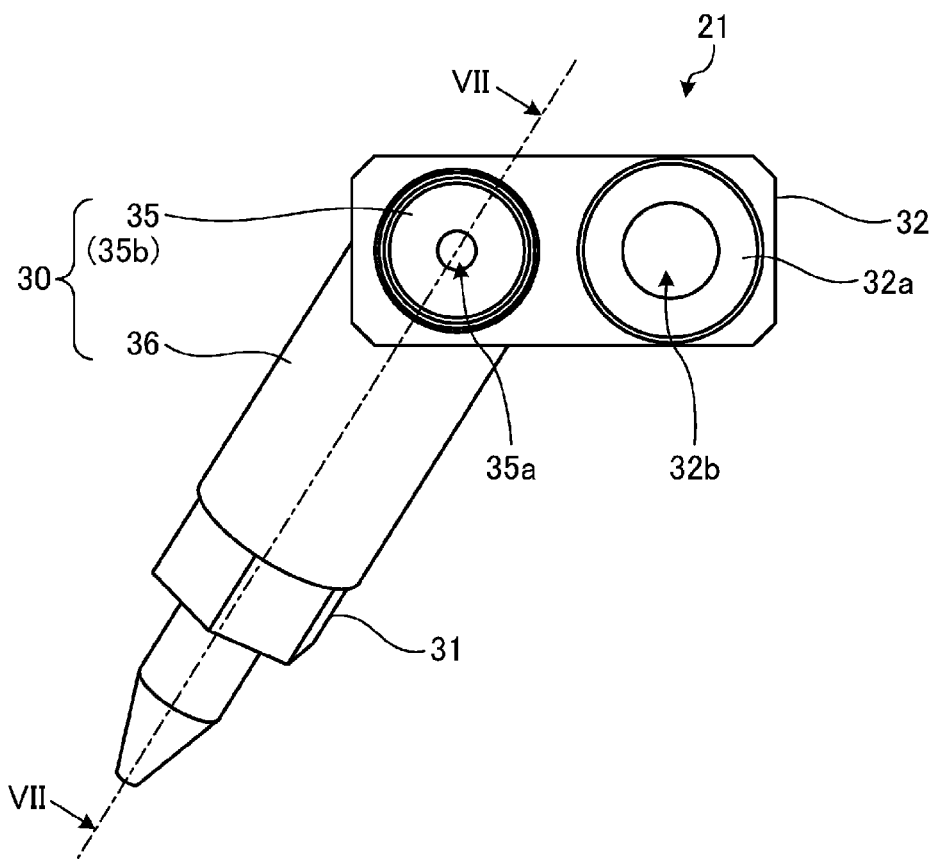
FIG. 6 is a plan view of the processing liquid ejection nozzle according to the first embodiment.
Figure 7:
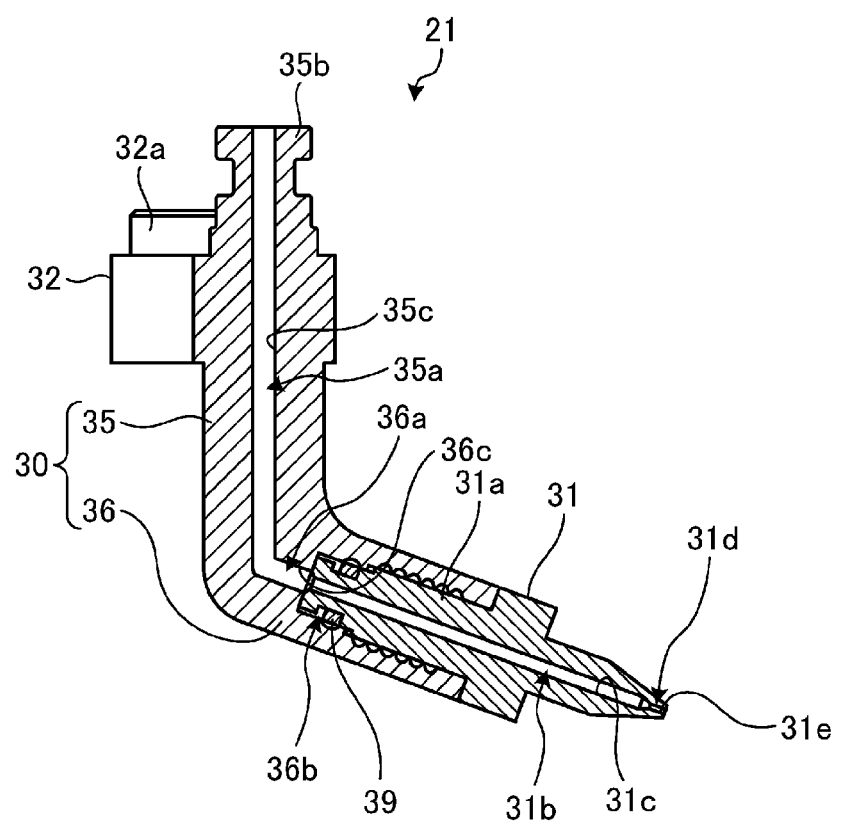
FIG. 7 is a cross-sectional view taken along the VII-VII line of FIG. 6.

Next, the processing liquid ejection nozzle 21 will be described with reference to FIGS. 5 to 7. FIG. 5 is a front view of the processing liquid ejection nozzle 21 according to the first embodiment. FIG. 6 is a plan view of the processing liquid ejection nozzle 21 according to the first embodiment. FIG. 7 is a cross-sectional view taken along the VII-VII line of FIG. 6.

The processing liquid ejection nozzle 21 ejects the processing liquid used for a substrate processing. The processing liquid ejection nozzle 21 includes a nozzle main body 30, a nozzle ejector 31, and a connection portion 32.

The nozzle main body 30 includes a first main body 35 and a second main body 36. The first main body 35 extends in the Z-axis direction. A first flow path 35a is formed in the first main body 35 as illustrated in FIG. 7. The first flow path 35a is formed along the Z-axis direction. The first flow path 35a communicates with the processing liquid supply path 20a of the nozzle block 20 (see FIG. 4). That is, the first flow path 35a is formed in the first main body 35 to communicate with the processing liquid supply path 20a. The introduction portion 35b is provided above the first main body 35 to be inserted into the third recess 20d of the nozzle block 2 (see FIG. 4). The outer wall surface of the introduction portion 35b is formed in a circular shape.

An O-ring 38 (see FIG. 4) is provided between the introduction portion 35b and the third recess 20d of the nozzle block 20. The O-ring 38 prevents the processing liquid from leaking from between the first main body 35 and the nozzle block 20.

The second main body 36 is provided to be bent from the first main body 35, and extends obliquely downward from the lower end of the first main body 35. Specifically, the second main body 36 extends obliquely downward in accordance with the rotation direction of the substrate W.

In the processing liquid ejection nozzle 21 provided in the left arm 5L and the processing liquid ejection nozzle 21 provided in the right arm 5R, each second main body 36 extends obliquely downward from the lower end of the first main body 35 in accordance with the rotation direction of the substrate W. Thus, in the processing liquid ejection nozzle 21 provided in the left arm 5L and the processing liquid ejection nozzle 21 provided in the right arm 5R, the directions in which the respective second main bodies 36 extend are opposite to each other in, for example, the Y-axis direction.

A second flow path 36a is formed in the second main body 36 as illustrated in FIG. 7. The second flow path 36a extends obliquely downward from the lower end of the first flow path 35a. The second flow path 36a communicates with the first flow path 35a. In this way, the second flow path 36a is formed in the second main body 36 to communicate with the first flow path 35a, and the second main body 36 is bent from the first main body 35.

A recess 36b is formed in the second main body 36. The recess 36b is formed to be recessed from the lower end of the second main body 36 toward the first main body 35. The nozzle ejector 31 is inserted into the recess 36b. A screw groove is formed in a portion of the inner wall surface of the recess 36b.

The nozzle ejector 31 ejects the processing liquid toward the peripheral edge of the substrate W. The nozzle ejector 31 extends along the direction in which the second main body 36 extends. That is, the nozzle ejector 31 extends obliquely downward along the second main body 36.

The nozzle ejector 31 is inserted into the recess 36b of the second main body 36 so as to be attached to the nozzle main body 30. The nozzle ejector 31 is attachable/detachable to/from the tip of the second main body 36.

A screw thread is formed in an insertion portion 31a of the nozzle ejector 31 to be inserted into the recess 36b of the second main body 36. The screw thread is formed in accordance with the screw groove formed in the inner wall surface of the recess 36b. The nozzle ejector 31 is screwed into the nozzle main body 30.

An O-ring 39 is provided between the insertion portion 31a of the nozzle ejector 31 and the second main body 36. The O-ring 39 prevents the processing liquid from leaking from between the nozzle ejector 31 and the second main body 36.

An ejection flow path 31b is formed in the nozzle ejector 31 to communicate with the second flow path 36a. The diameter of the ejection flow path 31b is smaller than the diameter of the second flow path 36a. Specifically, the diameter of the inner wall surface 31c of the ejection flow path 31b is smaller than the diameter of the inner wall surface 36c of the second flow path 36a. The diameter of the inner wall surface 31c of the ejection flow path 31b is smaller than the diameter of the inner wall surface 35c of the first flow path 35a.

An ejection port 31d is formed at the tip of the nozzle ejector 31 to communicate with the ejection flow path 31b and configured to eject the processing liquid toward the substrate W. The diameter of the ejection port 31d is smaller than the diameter of the ejection flow path 31b. Specifically, the diameter of the inner wall surface 31e of the ejection port 31d is smaller than the diameter of the inner wall surface 31c of the ejection flow path 31b.

The diameter of the ejection flow path 31b and the diameter of the ejection port 31d are set according to a type of a processing, a type of a processing liquid to be ejected and others. That is, in the processing liquid ejection nozzle 21, the nozzle ejector 31 attached to the nozzle main body 30 may be replaced according to a type of a processing, a type of a processing liquid to be ejected and others.

As described above, the ejection flow path 31b is formed in the nozzle ejector 31 to communicate with the second flow path 36a, and the nozzle ejector 31 ejects the processing liquid to the peripheral edge of the substrate W. That is, the processing liquid ejection nozzle 21 ejects the processing liquid toward the peripheral edge of the substrate W.

As illustrated in FIGS. 5 and 6, the connection portion 32 extends horizontally with respect to the first main body 35. The connection portion 32 is formed to be integrated with the first main body 35. The attachment portion 32a is provided on the connection portion 32 to project upward. As illustrated in FIG. 6, a bolt hole 32b is formed in the attachment portion 32a such that a bolt 22 (see FIG. 4) is inserted into the bolt hole 32b. A screw groove is formed in the inner wall surface of the bolt hole 32b to correspond to a screw thread of the bolt 22. The bolt 22 is screwed into the connection portion 32. When the bolt 22 is screwed into the connection portion 32, the nozzle main body 30 is fixed to the nozzle block 20.

<Changing Ejection Angle of Processing Liquid by Processing Liquid Ejection Nozzle>

The processing liquid ejection nozzle 21 may be pivoted horizontally with respect to the nozzle block 20, by being pivoted around the introduction portion 35b inserted into the third recess 20d of the nozzle block 20. Further, the processing liquid ejection nozzle 21 may change the attachment position to the nozzle block 20, by changing the position of the second recess 20c into which the attachment portion 32a of the connection portion 32 is inserted. That is, the connection portion 32 (an example of an angle changing mechanism) may change the attachment position to the nozzle block 20 (an example of the fixing member). In other words, the connection portion 32 changes the angle of the nozzle main body 30 in the horizontal direction with respect to the nozzle block 20 (an example of the fixing member) to which the nozzle main body 30 is fixed.

By changing the attachment position of the nozzle main body 30 to the nozzle block 20, the ejection angle of the processing liquid with respect to the nozzle block 20 may be changed. That is, the processing liquid ejection nozzle 21 may change the ejection angle of the processing liquid with respect to the substrate W. The ejection angle refers to a horizontal angle with respect to the tangent line of the substrate W at a position where the processing liquid ejected by the processing liquid ejection nozzle 21 reaches the substrate W.

<Change of Pivoting Angle by Arm>

In the arm 5, the arm portion 10 is pivotable around the axis in the Z-axis direction by the movement mechanism 11. That is, the movement mechanism 11 (an example of the pivoting mechanism) may horizontally pivot the arm portion 10. Thus, for example, during the ejection of the processing liquid to the substrate W, that is, during the substrate processing, the movement mechanism 11 may pivot the arm portion 10 to change the pivoting angle, thereby changing the ejection angle of the processing liquid with respect to the substrate W. The substrate processing may be performed without pivoting the arm portion 10 during the substrate processing.

Figure 8:
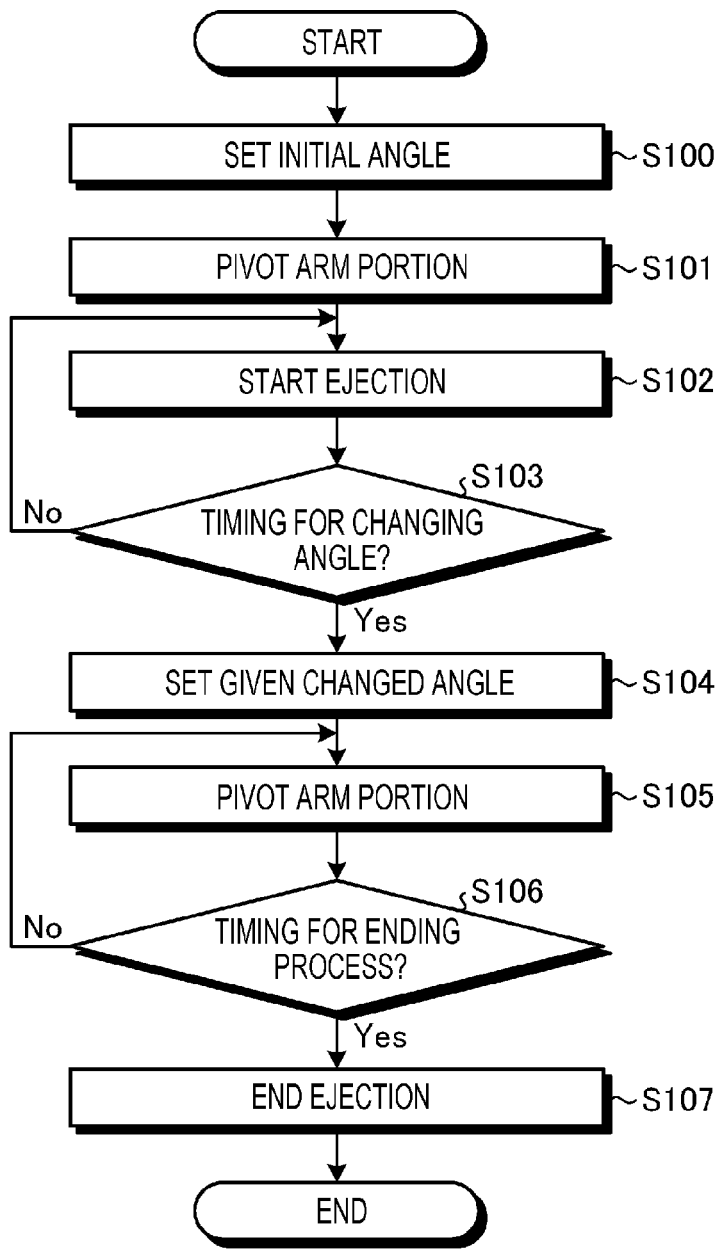
FIG. 8 is a flowchart illustrating an ejection angle changing process according to the first embodiment.

Here, the process of changing the ejection angle of the processing liquid by the arm 5 will be described with reference to FIG. 8. FIG. 8 is a flowchart illustrating the ejection angle changing process according to the first embodiment. The ejection angle changing process is performed in the way that the controller 6b of the control device 6 controls the processing liquid ejection nozzle 21 and the holder 3.

The controller 6b sets an initial angle of the arm portion 10 according to a processing on the substrate W (S100). That is, the controller 6b sets the pivoting angle in the movement mechanism 11 (an example of the pivoting mechanism) according to the substrate processing.

The controller 6b pivots the arm portion 10 according to the set initial angle (S101), and starts ejecting the processing liquid from the processing liquid ejection nozzle 21 according to the initial angle (S102). That is, the controller 6b causes the processing liquid to be ejected toward the substrate W at the set pivoting angle.

The controller 6b determines whether it is a timing to change the angle (S103). For example, the controller 6b determines whether a given first time has elapsed since the ejection of the processing liquid is started. The given first time is preset.

When it is determined that it is not the timing to change the angle (S103: No), the controller 6b continues to eject the processing liquid at the initial angle (S102).

When it is determined that it is the timing to change the angle (S103: Yes), the controller 6b sets the angle of the arm portion 10 to a given changed angle (S104). The given changed angle is preset. The controller 6b pivots the arm portion 10 according to the given changed angle that has been set (S105). That is, the controller 6b changes the pivoting angle during the substrate processing.

The controller 6b determines whether it is a timing to end the process (S106). For example, the controller 6b determines whether a given second time has elapsed since the angle of the arm portion 10 is changed to the given changed angle. The given second time is preset.

When it is determined that it is not the timing to end the process (S106: No), the controller 6b continues the process at the given changed angle (S105). When it is determined that it is the timing to end the process (S106: Yes), the controller 6b ends the ejection of the processing liquid (S107).

<Effects>

The processing liquid ejection nozzle 21 includes the nozzle main body 30 and the connection portion 32 (an example of the angle changing mechanism). The nozzle main body 30 includes the first main body 35 and the second main body 36. The first flow path 35a is formed in the first main body 35 to communicate with the processing liquid supply path 20a. The second flow path 36a is formed in the second main body 36, and the second main body 36 is bent from the first main body 35. The connection portion 32 changes the angle of the nozzle main body 30 in the horizontal direction with respect to the nozzle block 20 (an example of the fixing member) to which the nozzle main body 30 is fixed. Specifically, the connection portion 32 may change the attachment position to the nozzle block 20.

As a result, the processing liquid ejection nozzle 21 may change the ejection angle of the processing liquid according to a processing on the substrate W, for example, a type of a film on the substrate W or a type of a processing liquid to be ejected to the substrate W. Thus, the processing liquid ejection nozzle 21 may suppress, for example, the processing liquid for etching the peripheral edge of the substrate W from being scattered from the substrate W after reaching the substrate W. As a result, it is possible to suppress the scattered processing liquid from adhering to a portion where the etching is not performed, and to suppress the generation of particles.

Further, the processing liquid ejection nozzle 21 includes the nozzle ejector 31. The ejection flow path 31b is formed in the nozzle ejector 31 to communicate with the second flow path 36a, and the nozzle ejector 31 ejects the processing liquid to the substrate W. The nozzle ejector 31 is attachable/detachable to/from the tip of the second main body 36.

As a result, the nozzle ejector 31 of the processing liquid ejection nozzle 21 may be replaced according to a processing on the substrate W. Thus, for example, the processing liquid ejection nozzle 21 may accurately etch the peripheral edge of the substrate W. Further, for example, when the processing liquid is clogged in the ejection port 31d of the nozzle ejector 31, the nozzle ejector 31 may be replaced, so that the substrate processing may be easily restored.

Further, the processing liquid ejection nozzle 21 may reduce bubbles generated when the processing liquid flows from the first flow path 35a to the second flow path 36a, while causing the processing liquid to flow through the ejection flow path 31b. Thus, the processing liquid ejection nozzle 21 may suppress the bubbles from being included in the processing liquid ejected to the substrate W, and may stabilize the ejection state of the processing liquid.

Further, the diameter of the ejection flow path 31b is smaller than the diameter of the second flow path 36a.

As a result, the processing liquid ejection nozzle 21 may suppress the generation of bubbles when the processing liquid flows from the second flow path 36a into the ejection flow path 31b. Thus, the processing liquid ejection nozzle 21 may suppress the bubbles from being included in the processing liquid ejected to the substrate W, and may stabilize the ejection state of the processing liquid.

Further, the arm 5 (an example of a nozzle arm) is provided with the processing liquid ejection nozzle 21, the nozzle block 20 (an example of the fixing member), the arm portion 10, and the movement mechanism 11 (an example of the pivoting mechanism). The fixing member is attached to the arm portion 10. The movement mechanism 11 pivots the arm portion 10 in the horizontal direction. The substrate processing apparatus 1 sets the pivoting angle in the movement mechanism 11 according to the substrate processing, and ejects the processing liquid to the substrate W at the set pivoting angle.

As a result, the substrate processing apparatus 1 may eject the processing liquid at the ejection angle according to the substrate processing, and may accurately etch the peripheral edge of the substrate W.

Further, the substrate processing apparatus 1 changes the pivoting angle during the substrate processing.

As a result, the substrate processing apparatus 1 may uniquely eject the processing liquid to the peripheral edge of the substrate W, and accurately etch the peripheral edge of the substrate W.

Second Embodiment

Next, a substrate processing apparatus 1 according to a second embodiment will be described. The substrate processing apparatus 1 according to the second embodiment is different from the substrate processing apparatus 1 according to the first embodiment in a processing liquid supply 50. Thus, the processing liquid supply 50 according to the second embodiment will be described. Meanwhile, the same portions as those of the processing liquid supply 12 according to the first embodiment will be denoted by the same reference numerals as used in the first embodiment, and detailed descriptions thereof will be omitted.

<Processing Liquid Supply>

Figure 9:
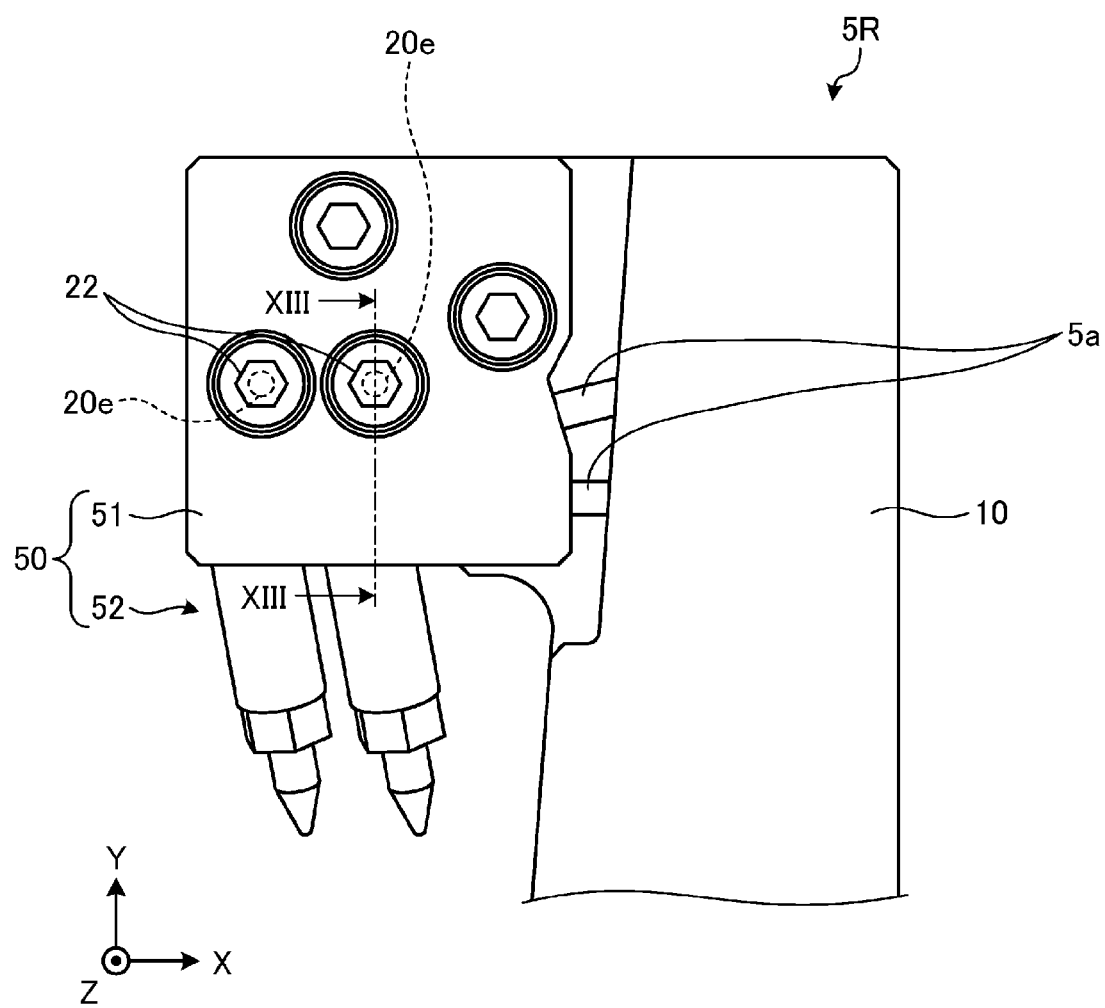
FIG. 9 is a plan view of a processing liquid supply according to a second embodiment.

In a nozzle block 51 of the processing liquid supply 50, one through hole 20e is formed for one processing liquid ejection nozzle 52, as illustrated in FIG. 9. FIG. 9 is a plan view of the processing liquid supply 50 according to the second embodiment. The processing liquid supply 50 of FIG. 9 correspond to the processing liquid supply 50 provided in the right arm 5R.

Figure 10:
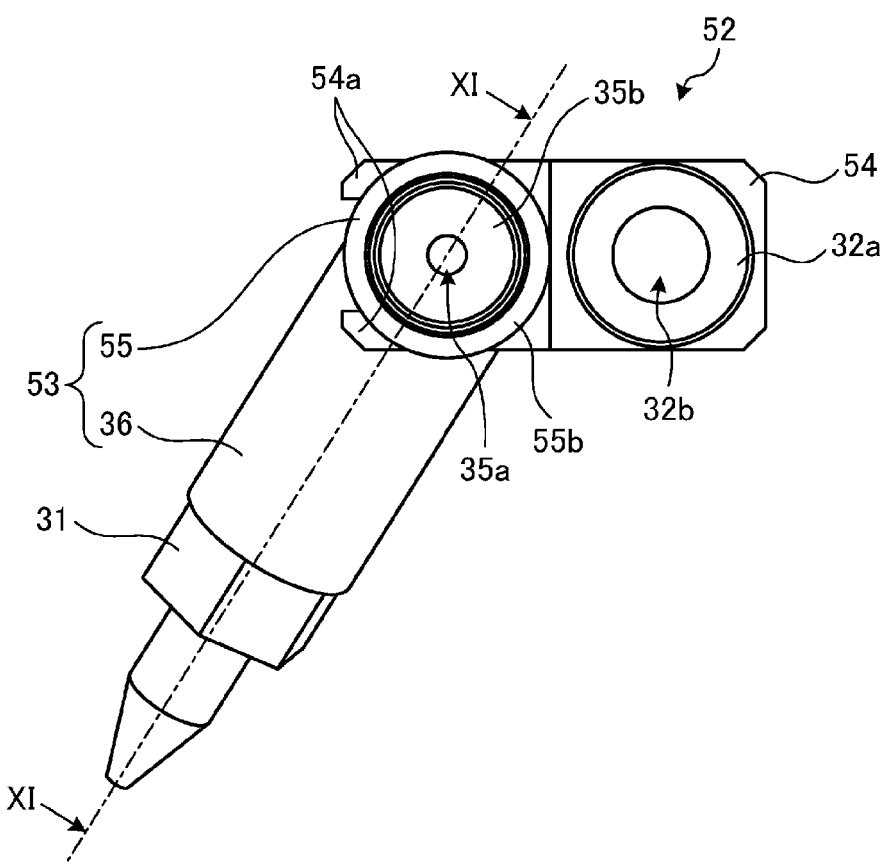
FIG. 10 is a plan view of a processing liquid ejection nozzle according to the second embodiment.
Figure 11:
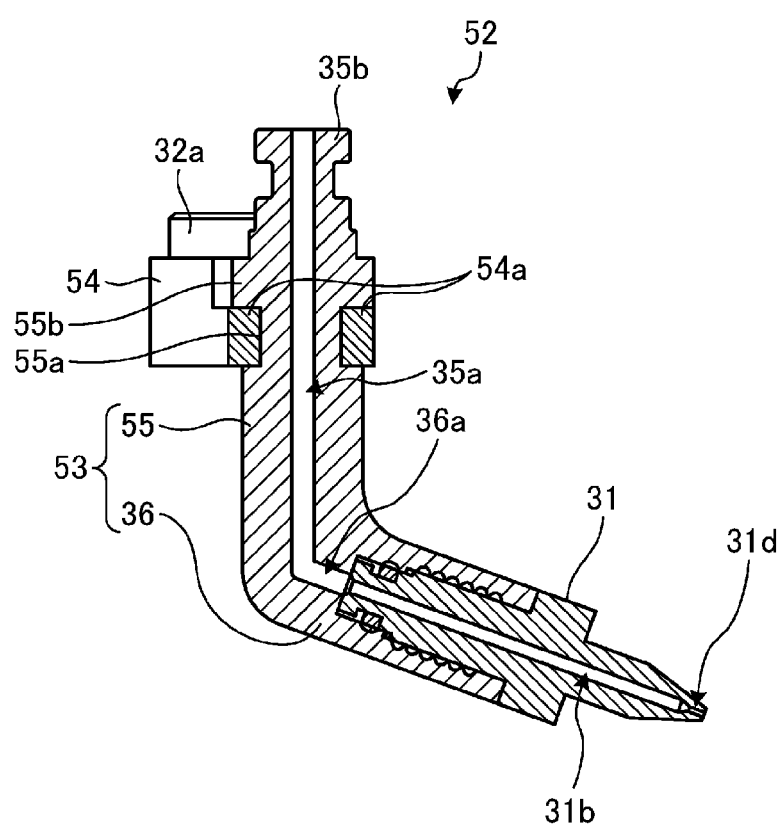
FIG. 11 is a cross-sectional view taken along the XI-XI line of FIG. 10.

As illustrated in FIGS. 10 and 11, in the processing liquid ejection nozzle 52, a nozzle main body 53 and a connection portion 54 are provided as separate portions. FIG. 10 is a plan view of the processing liquid ejection nozzle 52 according to the second embodiment. FIG. 11 is a cross-sectional view taken along the XI-XI line of FIG. 10.

As illustrated in FIG. 11, an engagement groove 55a is formed in the first main body 55. The engagement groove 55a is formed below the introduction portion 35b. The engagement groove 55a is formed over the entire circumference of the first main body 55. With the formation of the engagement groove 55a, an engagement portion 55b is formed between the introduction portion 35b and the engagement groove 55a. The diameter of the outer wall surface of the engagement portion 55b is larger than the diameter of the outer wall surface of the introduction portion 35b.

The connection portion 54 includes a pair of arms 54a. The pair of arms 54a are inserted into the engagement groove 55a such that the first main body 55 is sandwiched between the pair of arms 54a. The first main body 55 is horizontally pivotable in a state of being sandwiched between the pair of arms 54a. That is, the connection portion 54 (an example of the angle changing mechanism) pivotably supports the first main body 55. The upper surfaces of the arms 54a are in contact with the engagement portion 55b of the first main body 55. That is, the pair of arms 54a are engaged with the engagement portion 55b.

Figure 12:
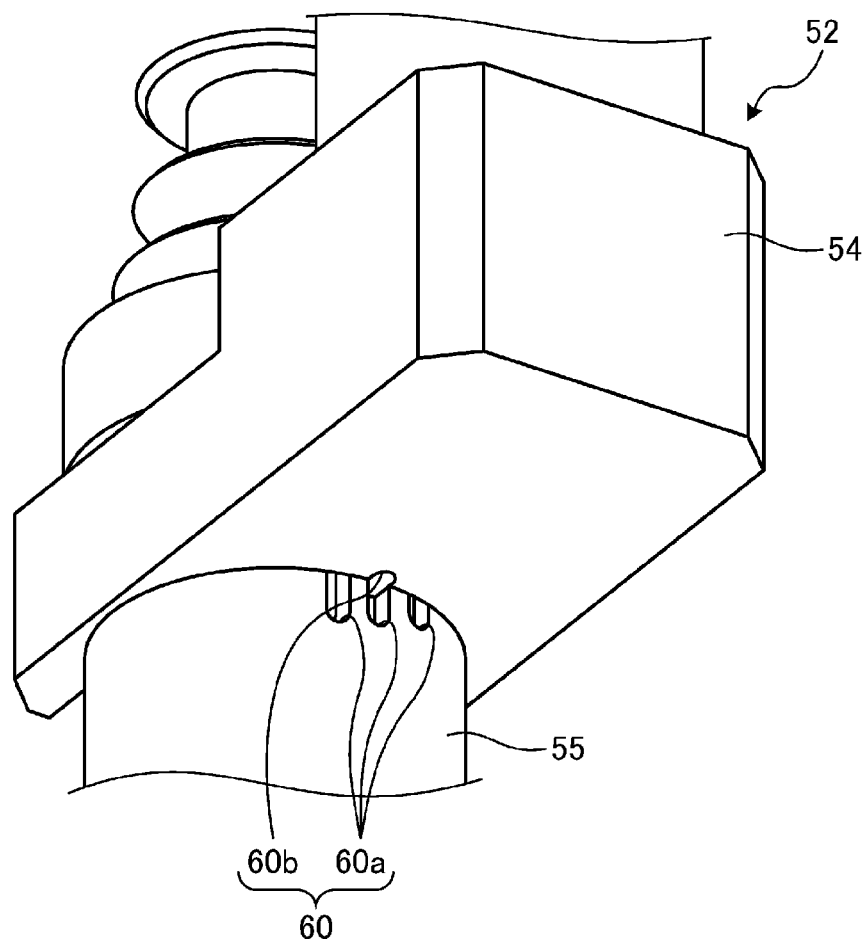
FIG. 12 is a perspective view of the processing liquid ejection nozzle according to the second embodiment when viewed obliquely from below.

As illustrated in FIG. 12, an alignment unit 60 is provided in the first main body 55 and the connection portion 54. FIG. 12 is a perspective view of the processing liquid ejection nozzle 52 according to the second embodiment when viewed obliquely from below. The alignment unit 60 includes a first alignment groove 60a and a second alignment groove 60b.

The first alignment groove 60a is formed in the first main body 55. The first alignment groove 60a is formed in the first main body 55 below the engagement groove 55a (see FIG. 11). A plurality of first alignment grooves 60a are formed on the outer wall surface of the first main body 55. Specifically, the plurality of first alignment grooves 60a are formed along the circumferential direction of the first main body 55.

The second alignment groove 60b is formed in the connection portion 54. For example, the second alignment groove 60b may be formed to penetrate the connection portion 54 in the Z-axis direction.

Figure 13:
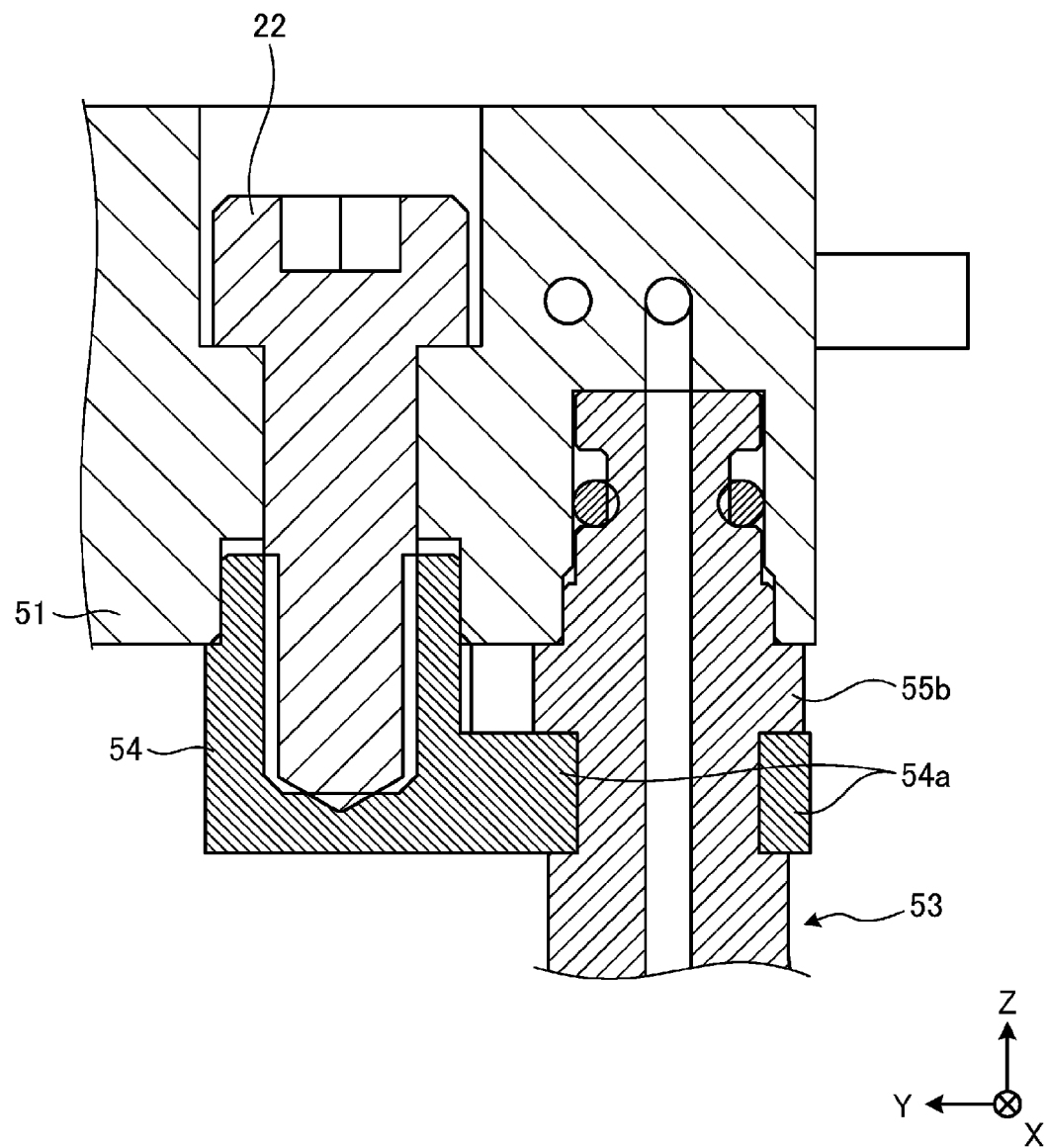
FIG. 13 is a cross-sectional view taken along the XIII-XIII line of FIG. 9.

When the connection portion 54 is fixed to the nozzle block 51 by the bolt 22, the engagement portion 55b of the first main body 55 of the nozzle main body 53 is sandwiched between the arm 54a of the connection portion 54 and the nozzle block 51 in the Z-axis direction, as illustrated in FIG. 13. As a result, the nozzle main body 53 is fixed to the nozzle block 51. FIG. 13 is a cross-sectional view taken along the XIII-XIII line of FIG. 9.

<Changing Ejection Angle of Processing Liquid by Processing Liquid Ejection Nozzle>

The first main body 55 is horizontally pivotable with respect to the connection portion 54 in a state where the nozzle main body 53 is not fixed to the nozzle block 51 by the bolt 22. For example, the processing liquid ejection nozzle 52 may change the ejection angle of the processing liquid with respect to the nozzle block 51, by changing the position where the first alignment groove 60a of the first main body 55 and the second alignment groove 60b of the connection portion 54 fit to each other. That is, the nozzle main body 53 and the connection portion 54 are provided with the alignment unit 60 that changes the angle of the nozzle main body 53 in the horizontal direction with respect to the nozzle block 51 (an example of the fixing member).

<Effects>

In the processing liquid ejection nozzle 52, the connection portion 54 (an example of the angle changing mechanism) pivotably supports the first main body 55.

As a result, the processing liquid ejection nozzle 52 may change the ejection angle of the processing liquid according to a processing on the substrate W, for example, a type of a film on the substrate W or a type of a processing liquid to be ejected to the substrate W. Thus, the generation of particles may be suppressed.

Further, the first main body 55 and the connection portion 54 are provided with the alignment unit 60. The alignment unit 60 changes the angle of the nozzle main body 53 in the horizontal direction with respect to the nozzle block 51 (an example of the fixing member).

As a result, an operator may easily adjust the angle of the first main body 55 in the horizontal direction with respect to the connection portion 54 fixed to the nozzle block 51, based on the alignment unit 60. Thus, the operator may easily set the ejection angle of the processing liquid.

<Modification of Second Embodiment>

As for the alignment unit 60, the processing liquid ejection nozzle 52 according to a modification may form an alignment groove in one of the first main body 55 and the connection portion 54, and form a projecting piece to be inserted into the alignment groove on the other of the first main body 55 and the connection portion 54.

As a result, the processing liquid ejection nozzle 52 according to the modification may suppress the first main body 55 from being pivoted with respect to the connection portion 54. Thus, the processing liquid ejection nozzle 52 according to the modification may suppress the ejection angle of the processing liquid from being deviated from the set ejection angle.

Third Embodiment

Next, a substrate processing apparatus 1 according to a third embodiment will be described. The substrate processing apparatus 1 according to the third embodiment is different from the substrate processing apparatus 1 according to the second embodiment in a processing liquid supply 70. Thus, the processing liquid supply 70 according to the third embodiment will be described. The same portions as those of the processing liquid supply 12 according to the first embodiment or the processing liquid supply 50 according to the second embodiment will be denoted by the same reference numerals as used in the first or second embodiment, and detailed descriptions thereof will be omitted.

<Processing Liquid Supply>

Figure 14:
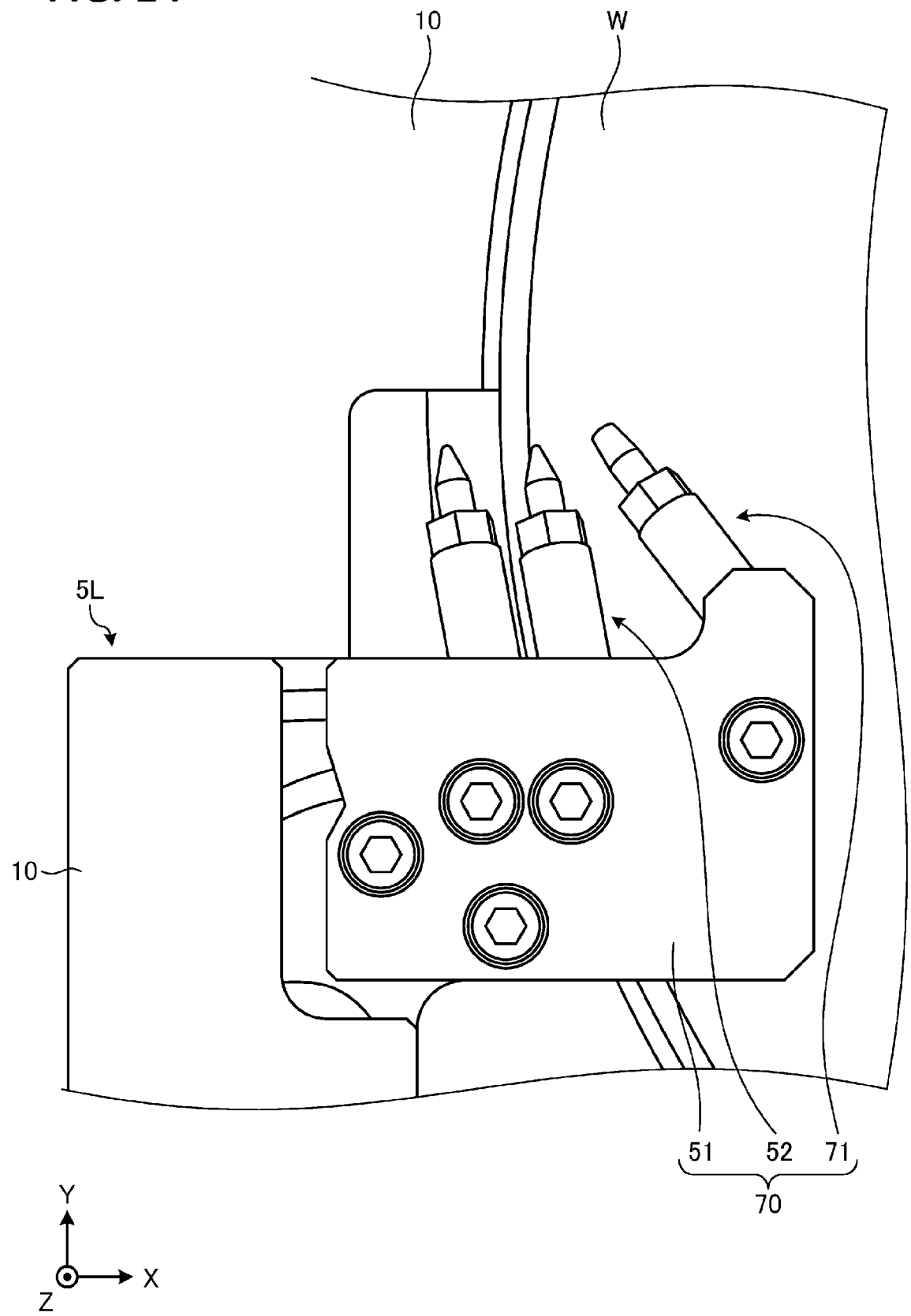
FIG. 14 is a plan view of a processing liquid supply according to a third embodiment.

As illustrated in FIG. 14, the processing liquid supply 70 further includes a gas ejection nozzle 71. FIG. 14 is a plan view of the processing liquid supply 70 according to the third embodiment. The processing liquid supply 70 of FIG. 14 corresponds to the processing liquid supply 70 provided on the left arm 5L.

The gas ejection nozzle 71 is attached to the nozzle block 51. The gas ejection nozzle 71 is disposed inner than the processing liquid ejection nozzle 52. Specifically, the gas ejection nozzle 71 is disposed at an inner side than the processing liquid ejection nozzle 52 in the radial direction of the substrate W.

The gas ejection nozzle 71 ejects a gas, for example, nitrogen gas, outward. The gas ejection nozzle 71 ejects a gas for discharging the processing liquid scattered above the substrate W after reaching the substrate W to the outside of the substrate W.

Figure 15:
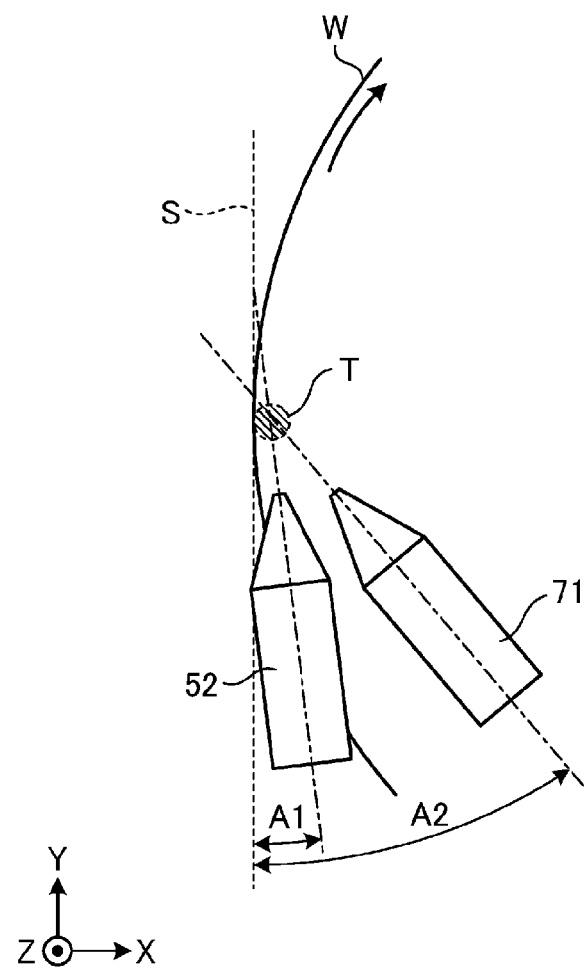
FIG. 15 is a schematic view illustrating an arrangement of a processing liquid ejection nozzle and a gas ejection nozzle according to the third embodiment.

The gas ejection nozzle 71 ejects the gas at an ejection angle larger than the ejection angle of the processing liquid in the horizontal direction. Specifically, as illustrated in FIG. 15, the gas ejection nozzle 71 ejects the gas at an ejection angle A2 larger than an ejection angle A1 of the processing liquid with respect to the tangent line S of the substrate W at a position T where the processing liquid ejected by the processing liquid ejection nozzle 52 reaches the substrate W. That is, the gas ejection nozzle 71 ejects the gas at the ejection angle A2 larger than the ejection angle A1 of the processing liquid with respect to the tangent line of the substrate in the horizontal direction. FIG. 15 is a schematic view illustrating the arrangement of the processing liquid ejection nozzle 52 and the gas ejection nozzle 71 according to the third embodiment.

The gas ejection nozzle 71 ejects the gas toward the upper side of the substrate W. Specifically, the gas ejection nozzle 71 ejects the gas toward the upper side of the position where the processing liquid ejected by the processing liquid ejection nozzle 52 reaches the substrate W. The gas ejection nozzle 71 may eject the gas toward the upper side of a slightly downstream portion of the substrate W in the rotation direction of the substrate W from the position where the processing liquid ejected by the processing liquid ejection nozzle 52 reaches the substrate W.

<Effects>

The processing liquid supply 70, that is, the arm 5 includes the gas ejection nozzle 71. The gas ejection nozzle 71 ejects the gas for discharging the processing liquid scattered above the substrate W after reaching the substrate W to the outside of the substrate W.

As a result, the arm 5 may suppress the processing liquid scattered after reaching the substrate W from adhering to the radially inner side of the substrate W. Thus, the arm 5 may suppress the scattered processing liquid from adhering to a portion where the etching is not performed, and may suppress the generation of particles.

Further, the gas ejection nozzle 71 is disposed at an inner side than the processing liquid ejection nozzle 52.

As a result, the gas ejection nozzle 71 may discharge the processing liquid scattered after reaching the substrate W, toward the outside of the substrate W. Thus, the arm 5 may suppress the scattered processing liquid from adhering to a portion where the etching is not performed, and may suppress the generation of particles.

Further, the gas ejection nozzle 71 ejects the gas at the ejection angle larger than the ejection angle of the processing liquid in the horizontal direction.

As a result, the arm 5 may immediately discharge the processing liquid scattered after reaching the substrate W to the outside of the substrate W. Thus, the arm 5 may suppress the scattered processing liquid from adhering to a portion where the etching is not performed, and may suppress the generation of particles.

Further, the gas ejection nozzle 71 ejects the gas toward the upper side of the substrate W.

As a result, the arm 5 may proceed with the etching process of the peripheral edge of the substrate W while suppressing the processing liquid ejected and adhering to the peripheral edge of the substrate W from being discharged to the outside of the substrate W.

Fourth Embodiment

Figure 16:
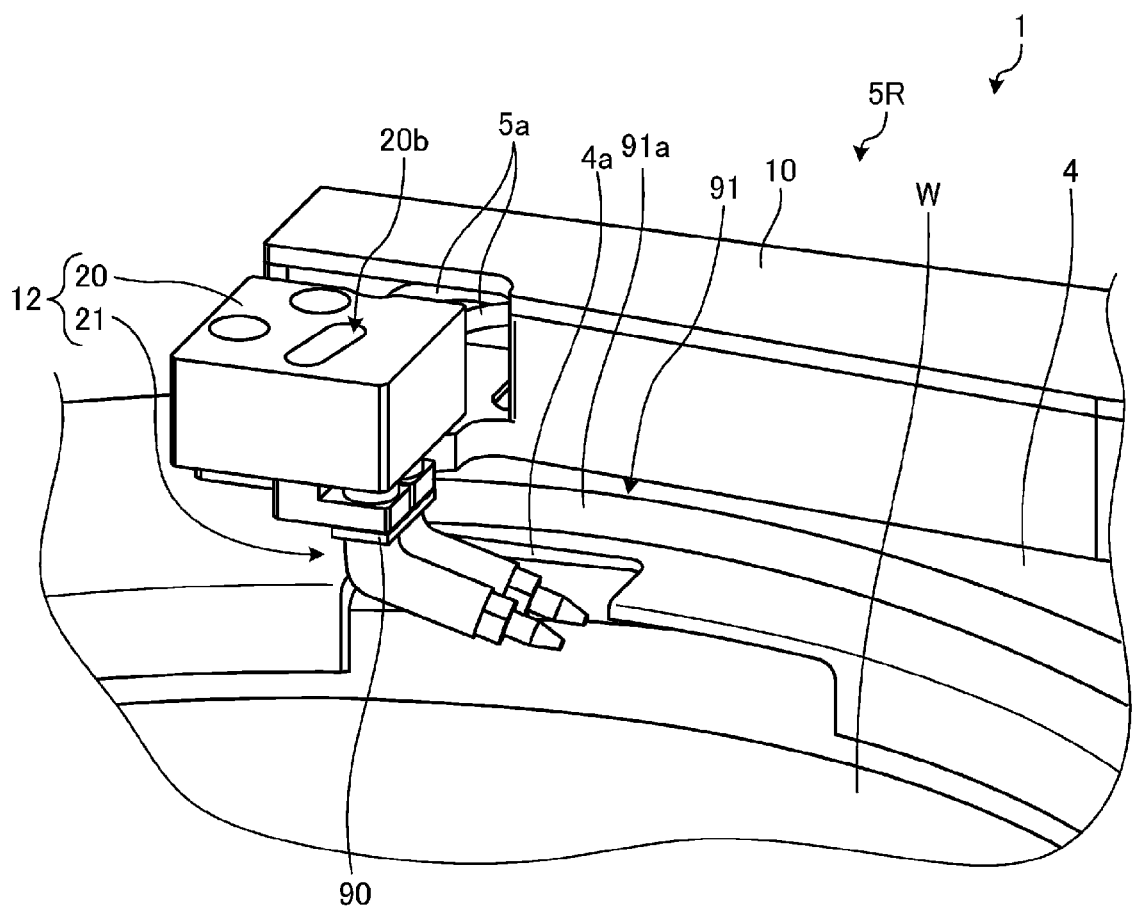
FIG. 16 is a perspective view illustrating a portion of a substrate processing apparatus according to a fourth embodiment.
Figure 17:
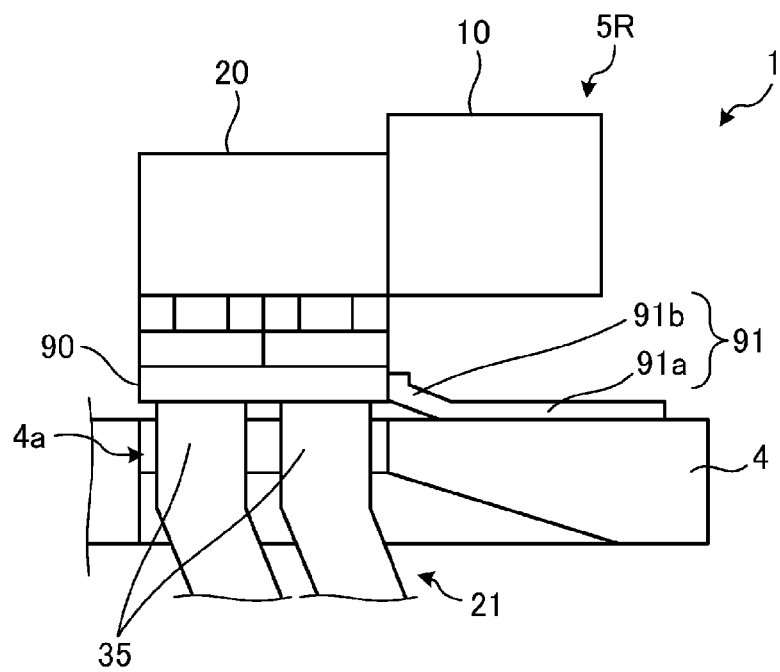
FIG. 17 is a schematic view illustrating a state where a processing liquid ejection nozzle is at a standby position, in the substrate processing apparatus according to the fourth embodiment.
Figure 18:
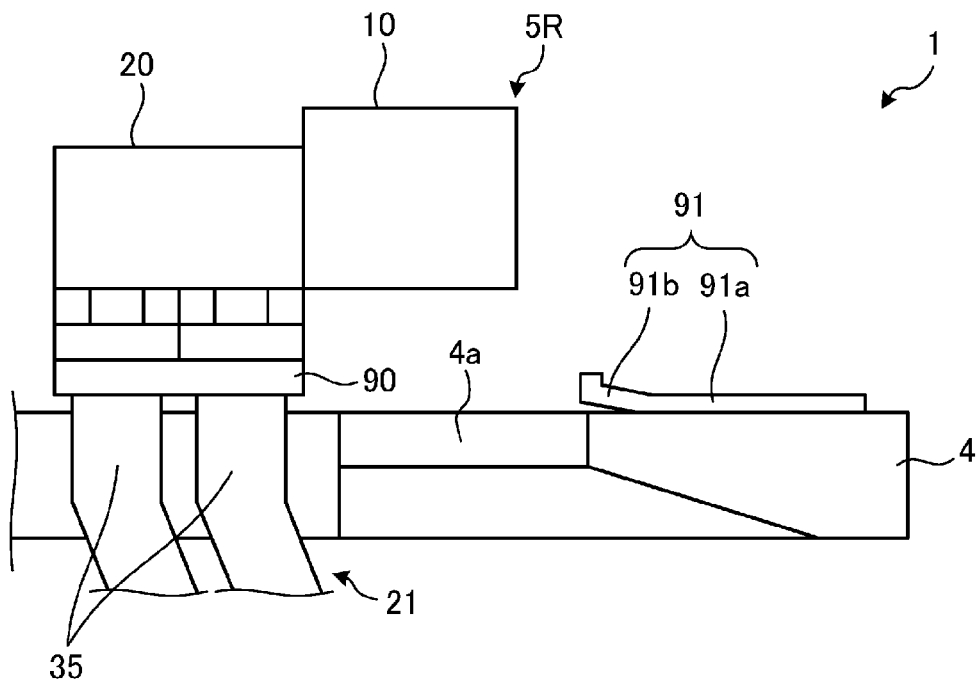
FIG. 18 is a schematic view illustrating a state where the processing liquid ejection nozzle is at an ejection position, in the substrate processing apparatus according to the fourth embodiment.

Next, a substrate processing apparatus 1 according to a fourth embodiment will be described with reference to FIGS. 16 to 18. Here, descriptions will be made focusing on portions different from the substrate processing apparatus 1 according to the first embodiment. The same portions as those of the substrate processing apparatus 1 according to the first embodiment will be denoted by the same reference numerals as used in the first embodiment, and detailed descriptions thereof will be omitted. FIG. 16 is a perspective view illustrating a portion of the substrate processing apparatus 1 according to the fourth embodiment. FIG. 17 is a schematic view illustrating a state where the processing liquid ejection nozzle 21 is at the standby position, in the substrate processing apparatus 1 according to the fourth embodiment. FIG. 18 is a schematic view illustrating a state where the processing liquid ejection nozzle 21 is at the ejection position, in the substrate processing apparatus 1 according to the fourth embodiment. While the right arm 5R is described as an example here, the left arm 5L has the same configuration.

The substrate processing apparatus 1 further includes a first conduction unit 90 and a second conduction unit 91. The first conduction unit 90 comes into contact with the processing liquid ejection nozzle 21 to be electrically conducted with the processing liquid ejection nozzle 21. The first conduction unit 90 is attached to the processing liquid ejection nozzle 21. For example, the first conduction unit 90 is attached to the first main body 35 of the processing liquid ejection nozzle 21. The first conduction unit 90 is a conductive member and is, for example, a carbon-containing resin. The first conduction unit 90 moves together with the processing liquid ejection nozzle 21. The processing liquid ejection nozzle 21 and the first conduction unit 90 move along the X direction (see FIG. 1) by the movement mechanism 11 (see FIG. 1).

A hole is formed in the first conduction unit 90 such that the first main body 35 is slidable in the hole. That is, the substrate processing apparatus 1 may pivot the processing liquid ejection nozzle 21 with respect to the nozzle block 20 and change the ejection angle of the processing liquid with respect to the nozzle block 20, in a state where the processing liquid ejection nozzle 21 is in contact with the first main body 35. In the first conduction unit 90, the hole is formed by fitting two or more members to each other. That is, the first conduction unit 90 is configured by combining two or more members with each other. The first conduction unit 90 may be configured by one member. For example, in the first conduction unit 90, a notch is formed to communicate with the hole, and the first main body 35 may be inserted into the hole via the notch.

The second conduction unit 91 is electrically conducted with the processing liquid ejection nozzle 21 by coming into contact with the first conduction unit 90, so as to destaticize the processing liquid ejection nozzle 21. The second conduction unit 91 is a conductive member and is, for example, a carbon-containing film. The second conduction unit 91 is provided on the outer cup 4 (an example of the cup). The second conduction unit 91 includes a main body 91a and a deformable portion 91b.

The main body 91a is provided along the upper surface of the outer cup 4. The main body 91a is provided such that one end thereof is adjacent to a notch 4a of the outer cup 4. The other end of the main body 91a is connected to a conductive member (e.g., a metal member) outside the processing container 2 (see FIG. 1). The main body 91a may be connected to the conductive member outside the processing container 2 via an intermediate member. The intermediate member is a conductive member.

The deformable portion 91b is connected to the main body 91a. The deformable portion 91b is provided to extend obliquely upward toward the notch 4a from one end of the main body 91a. The deformable portion 91b is provided to protrude inward from the main body 91a in the radial direction of the substrate W. That is, the deformable portion 91b is supported by the main body 91a in a cantilevered state. The deformable portion 91b may come into contact with the first conduction unit 90. The deformable portion 91b is elastically deformed with respect to the main body 91a. The deformable portion 91b is not limited to the shape supported by the main body 91a in the cantilevered state, and only needs to be elastically deformed with respect to the main body 91a.

The deformable portion 91b comes into contact with the first conduction unit 90 when the first conduction unit 90 is at the contact position. The deformable portion 91b is not in contact with the first conduction unit 90 when the first conduction unit 90 is at the non-contact position.

The contact position includes, for example, the standby position. The deformable portion 91b comes into contact with the first conduction unit 90 when the processing liquid ejection nozzle 21 is at the standby position. When the processing liquid ejection nozzle 21 is at the standby position, the first conduction unit 90 and the second conduction unit 91 come into contact with each other, such that a conduction path is formed from the processing liquid ejection nozzle 21 to the conductive member outside the processing container 2. When the processing liquid ejection nozzle 21 and the conductive member outside the processing container 2 are electrically conducted with each other, the processing liquid ejection nozzle 21 is destaticized.

The non-contact position includes, for example, the ejection position. The deformable portion 91b is not in contact with the first conduction unit 90 when the processing liquid ejection nozzle 21 is at the ejection position. That is, when the processing liquid ejection nozzle 21 is at the ejection position, the first conduction unit 90 and the second conduction unit 91 are not in contact with each other, and thus, no conduction path is formed from the processing liquid ejection nozzle 21 and the conductive member outside the processing container 2.

The first conduction unit 90 moves together with the processing liquid ejection nozzle 21 by the movement mechanism 11 (see FIG. 1). That is, the movement mechanism 11 switches the positions of the processing liquid ejection nozzle 21 and the position of the first conduction unit 90 between the contact position where the first conduction unit 90 and the second conduction unit 91 come into contact with each other and the non-contact position where the first conduction unit 90 and the second conduction unit 91 are not in contact with each other.

When the processing liquid ejection nozzle 21 moves from the non-contact position (the ejection position) to the contact position (the standby position), the first conduction unit 90 and the deformable portion 91b of the second conduction unit 91 come into contact with each other. The deformable portion 91b is pressed by the first conduction unit 90, pivots around the side of the main body 91a as a fulcrum, and is deformed from the position where the deformable portion 91b is not in contact with the first conduction unit 90 (hereinafter, referred to as an "initial position"). As a result, the impact occurring when the first conduction unit 90 and the second conduction unit 91 come into contact with each other is suppressed. Since the deformable portion 91b is elastically deformed with respect to the main body 91a, the contact state between the first conduction unit 90 and the second conduction unit 91 is maintained.

When the processing liquid ejection nozzle 21 moves from the contact position (the standby position) to the non-contact position (the ejection position), the first conduction unit 90 and the deformable portion 91b of the second conduction unit 91 are separated from each other. Since the deformable portion 91b of the second conduction unit 91 is not pressed by the first conduction unit 90, the deformable portion 91b pivots around the side of the main body 91a as a fulcrum, and returns to the initial position.

<Effects>

When the processing liquid ejection nozzle 21 is charged, the processing liquid ejected from the processing liquid ejection nozzle 21 may adhere to the processing liquid ejection nozzle 21. The processing liquid that adheres to the processing liquid ejection nozzle 21 may drop on the substrate W or the like, and as a result, particles may be generated. Further, the processing liquid ejected from the processing liquid ejection nozzle 21 may be attracted toward the processing liquid ejection nozzle 21 and may drop on the substrate W or the like, and as a result, particles may be generated.

The substrate processing apparatus 1 includes the processing liquid ejection nozzle 21, the first conduction unit 90, the second conduction unit 91, and the movement mechanism 11. The first conduction unit 90 comes into contact with the processing liquid ejection nozzle 21, and is electrically conducted with the processing liquid ejection nozzle 21. The second conduction unit 91 is electrically conducted with the processing liquid ejection nozzle 21 by coming into contact with the first conduction unit 90, so as to destaticize the processing liquid ejection nozzle 21. The movement mechanism 11 switches the position of the processing liquid ejection nozzle 21 and the position of the first conduction unit 90 between the contact position where the first conduction unit 90 and the second conduction unit 91 come into contact with each other, and the non-contact position where the first conduction unit 90 and the second conduction unit 91 are not in contact with each other.

As a result, the substrate processing apparatus 1 may suppress the charging of the processing liquid ejection nozzle 21 by bringing the first conduction unit 90 and the second conduction unit 91 into contact with each other at the contact position. Thus, the substrate processing apparatus 1 may suppress the processing liquid from adhering to the processing liquid ejection nozzle 21. Further, the substrate processing apparatus 1 may suppress the processing liquid ejected from the processing liquid ejection nozzle 21 from being attracted toward the processing liquid ejection nozzle 21. Accordingly, the substrate processing apparatus 1 may suppress the generation of particles.

The second conduction unit 91 includes the deformable portion 91b. The deformable portion 91b is deformed when the deformable portion 91b comes into contact with the first conduction unit 90.

As a result, the substrate processing apparatus 1 may suppress the impact occurring when the first conduction unit 90 and the second conduction unit 91 come into contact with each other. Thus, the substrate processing apparatus 1 may suppress the deterioration of the first conduction unit 90 and the second conduction unit 91. Further, the substrate processing apparatus 1 may maintain the contact state between the first conduction unit 90 and the second conduction unit 91 at the contact position, by deforming the deformable portion 91b.

The substrate processing apparatus 1 includes the holder 3 and the outer cup 4 (an example of the cup). The holder 3 holds the substrate W thereon when the substrate processing is performed. The outer cup 4 is provided to surround the outer side of the substrate W held by the holder 3. The second conduction unit 91 is provided on the outer cup 4.

As a result, the disposition of the second conduction unit 91 is facilitated in the substrate processing apparatus 1.

<Modification of Fourth Embodiment>

In a substrate processing apparatus 1 according to a modification, the first conduction unit 90 may include the deformable portion, or each of the first conduction unit 90 and the second conduction unit 91 may include the deformable portion. That is, at least one conduction unit of the first conduction unit 90 and the second conduction unit 91 includes the deformable portion that is deformed when the deformable portion comes into contact with the other conduction unit.

As a result, the substrate processing apparatus 1 according to the modification may suppress the impact occurring when the first conduction unit 90 and the second conduction unit 91 come into contact with each other. Thus, the substrate processing apparatus 1 according to the modification may suppress the deterioration of the first conduction unit 90 and the second conduction unit 91. Further, the substrate processing apparatus 1 according to the modification may maintain the contact state between the first conduction unit 90 and the second conduction unit 91 at the contact position, by deforming the deformable portion.

Fifth Embodiment

Figure 19:
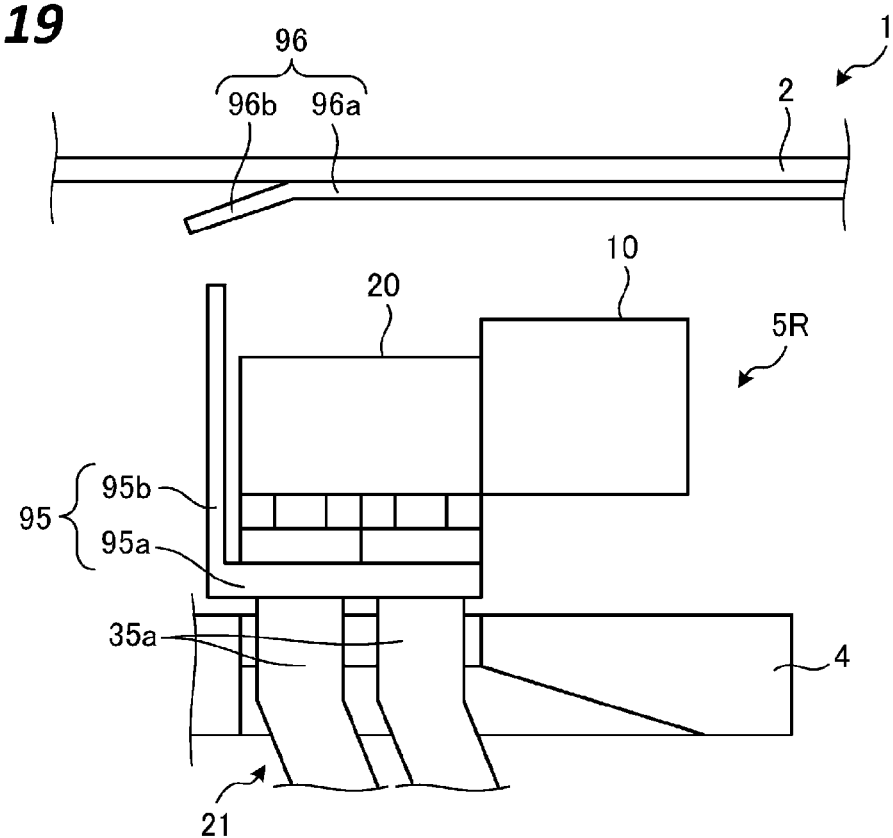
FIG. 19 is a schematic view illustrating a state where a first conduction unit is at a non-contact position, in a substrate processing apparatus according to a fifth embodiment.
Figure 20:
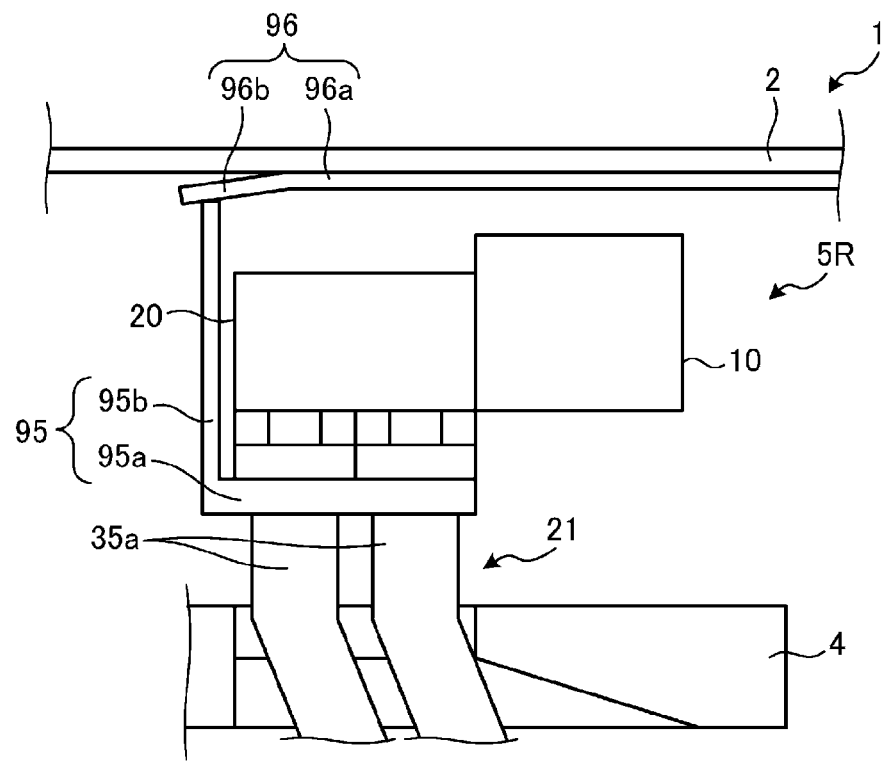
FIG. 20 is a schematic view illustrating a state where the first conduction unit is at a contact position, in the substrate processing apparatus according to the fifth embodiment.

A substrate processing apparatus 1 according to a fifth embodiment will be described with reference to FIGS. 19 and 20. The substrate processing apparatus 1 according to the fifth embodiment is different from the substrate processing apparatus 1 according to the fourth embodiment in a first conduction unit 95 and a second conduction unit 96. Here, descriptions will be made focusing on portions different from the substrate processing apparatus 1 according to the fourth embodiment. FIG. 19 is a schematic view illustrating a state where the first conduction unit 95 is at the non-contact position, in the substrate processing apparatus 1 according to the fifth embodiment. FIG. 20 is a schematic view illustrating a state where the first conduction unit 95 is at the contact position, in the substrate processing apparatus 1 according to the fifth embodiment.

The first conduction unit 95 includes a main body 95a and an arm 95b. The main body 95a is attached to the processing liquid ejection nozzle 21 and comes into contact with the processing liquid ejection nozzle 21. For example, the main body 95a is in contact with the first main body 35 of the processing liquid ejection nozzle 21. A hole is formed in the main body 95a such that the first main body 35 is slidable in the hole.

The arm 95b extends upward from the main body 95a. The arm 95b is provided such that the upper end thereof is disposed above the upper end of the nozzle block 20 and the upper end of the arm portion 10.

The second conduction unit 96 is provided in the processing container 2. Specifically, at least a portion of the second conduction unit 96 is provided on the ceiling of the processing container 2. The second conduction unit 96 includes a main body 96a and a deformable portion 96b. One end of the main body 96a is provided near the upper side of the standby position of the processing liquid ejection nozzle 21.

The deformable portion 96b is provided to extend obliquely downward from one end of the main body 96a. The deformable portion 96b is supported in a cantilever state with respect to the main body 96a. The deformable portion 96b is vertically pivotable with respect to the main body 96a.

The deformable portion 96b comes into contact with the first conduction unit 95 when the first conduction unit 95 is at the contact position. The contact position is a position where the processing liquid ejection nozzle 21 moves upward from the standby position.

The deformable portion 96b is not in contact with the first conduction unit 95 when the first conduction unit 95 is at the non-contact position. The non-contact position includes, for example, the ejection position and the standby position.

The movement mechanism 11 (see FIG. 1) switches the position of the processing liquid ejection nozzle 21 and the position of the first conduction unit 95 between the contact position and the non-contact position, by moving the processing liquid ejection nozzle 21 and the first conduction unit 95 up and down.

When the processing liquid ejection nozzle 21 moves upward from the standby position, the arm 95b of the first conduction unit 95 and the deformable portion 96b of the second conduction unit 96 come into contact with each other. The deformable portion 96b is pushed up by the arm 95b, and pivots upward from the initial position around the side of the main body 96a as a fulcrum, so as to be deformed.

When the processing liquid ejection nozzle 21 moves downward from the contact position, the arm 95b of the first conduction unit 95 is separated from the deformable portion 96b of the second conduction unit 96. The deformable portion 96b of the second conduction unit 96 pivots downward around the side of the main body 96a as a fulcrum, and returns to the initial position.

<Effects>

The substrate processing apparatus 1 includes the processing container 2. The processing container 2 accommodates the processing liquid ejection nozzle 21 and the movement mechanism 11 therein. The second conduction unit 96 is provided in the processing container 2. The movement mechanism 11 switches the position of the processing liquid ejection nozzle 21 and the position of the first conduction unit 95 between the contact position and the non-contact position, by moving the processing liquid ejection nozzle 21 and the first conduction unit 95 up and down.

As a result, in the substrate processing apparatus 1, it becomes easy to connect the second conduction unit 96 provided in the processing container 2 and the conductive member outside the processing container 2 to each other.

<Modification of Fifth Embodiment>

In a substrate processing apparatus 1 according to a modification, the arm 95b of the first conduction unit 95 may be configured to be deformable.

Sixth Embodiment

Figure 21:
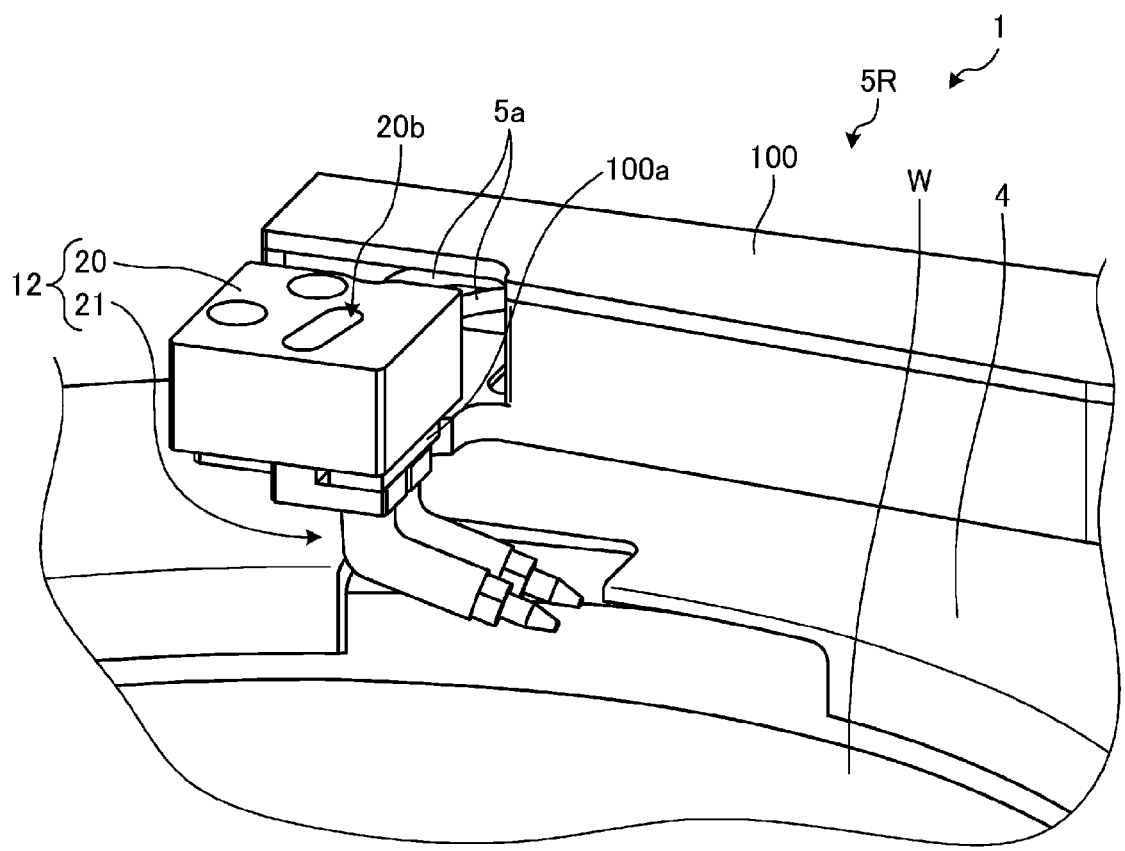
FIG. 21 is a perspective view illustrating a portion of a substrate processing apparatus according to a sixth embodiment.

A substrate processing apparatus 1 according to a sixth embodiment will be described with reference to FIG. 21. Here, descriptions will be made focusing on portions different from the substrate processing apparatus 1 according to the first embodiment. The same portions as those of the substrate processing apparatus 1 according to the first embodiment will be denoted by the same reference numerals as used in the first embodiment, and detailed description thereof will be omitted. FIG. 21 is a perspective view illustrating a portion of the substrate processing apparatus 1 according to the sixth embodiment. While the right arm 5R is described as an example here, the left arm 5L has the same configuration.

An arm portion 100 of the substrate processing apparatus 1 is a conductive member and is for example, a carbon-containing resin. The arm portion 100 comes into contact with the processing liquid ejection nozzle 21, and is electrically conducted with the processing liquid ejection nozzle 21. Specifically, the arm portion 100 includes a contact portion 100a. The contact portion 100a comes into contact with the processing liquid ejection nozzle 21, and is electrically conducted with the processing liquid ejection nozzle 21. A hole is formed in the contact portion 100a such that the processing liquid ejection nozzle 21 is slidable in the hole.

The arm portion 100 is connected to a conductive member (e.g., a metal member) outside the processing container 2 (see FIG. 1). The arm portion 100 forms a conduction path from the processing liquid ejection nozzle 21 to the conductive member outside the processing container 2. The conduction path is formed, regardless of the position of the processing liquid ejection nozzle 21. That is, the processing liquid ejection nozzle 21 is destaticized through the conduction path at all times.

<Effects>

The substrate processing apparatus 1 includes the processing liquid ejection nozzle 21 and the arm portion 100. The arm portion 100 comes into contact with the processing liquid ejection nozzle 21, and is electrically conducted with the processing liquid ejection nozzle 21.

As a result, in the substrate processing apparatus 1, the processing liquid ejection nozzle 21 is destaticized by the arm portion 100, so that the charging of the processing liquid ejection nozzle 21 may be suppressed. Thus, the substrate processing apparatus 1 may suppress the generation of particles caused from the charging of the processing liquid ejection nozzle 21.

Seventh Embodiment

Figure 22:
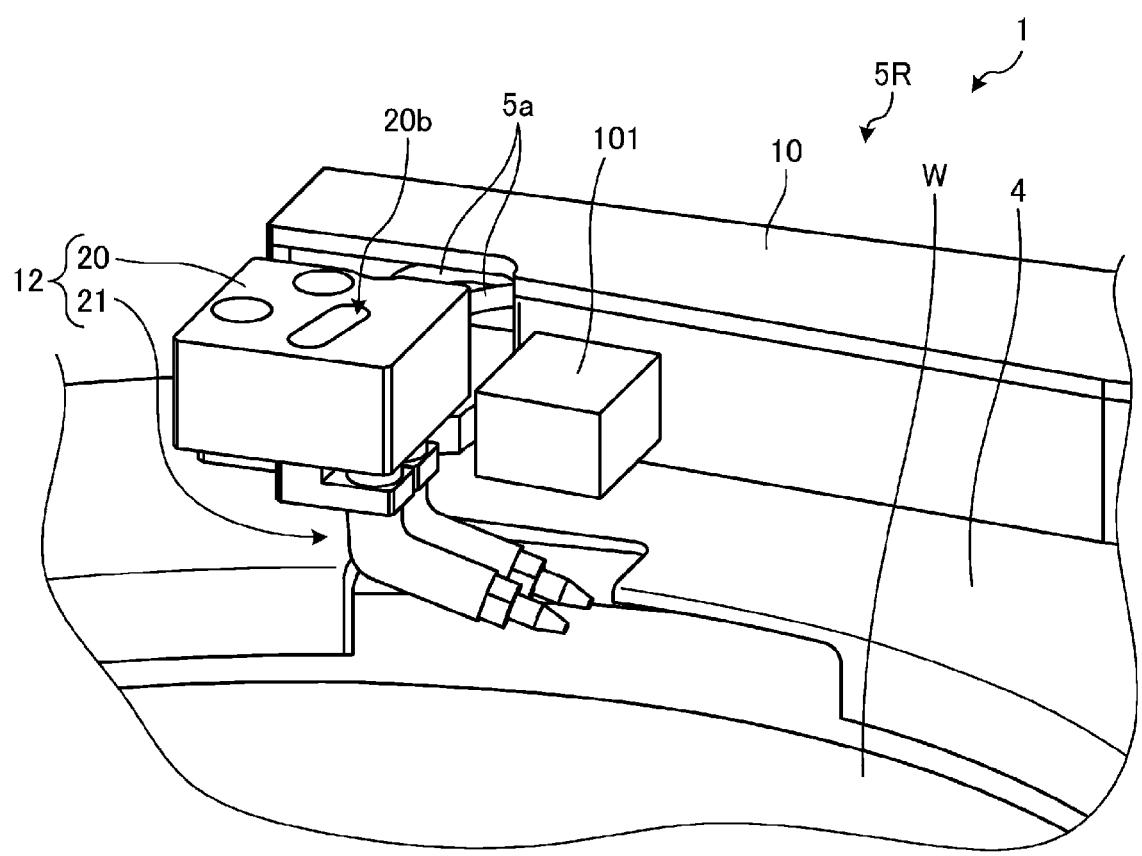
FIG. 22 is a perspective view illustrating a portion of a substrate processing apparatus according to a seventh embodiment.

A substrate processing apparatus 1 according to a seventh embodiment will be described with reference to FIG. 22. Here, descriptions will be made focusing on portions different from the substrate processing apparatus 1 according to the first embodiment. The same portions as those of the substrate processing apparatus 1 according to the first embodiment will be denoted by the same reference numerals as used in the first embodiment, and detailed description thereof will be omitted. FIG. 22 is a perspective view illustrating a portion of the substrate processing apparatus 1 according to the seventh embodiment. While the right arm 5R is described as an example here, the left arm 5L has the same configuration.

The substrate processing apparatus 1 includes an ionizer 101. The ionizer 101 is attached to the arm portion 10. The ionizer 101 is provided above the processing liquid ejection nozzle 21. The ionizer 101 destaticizes the processing liquid ejection nozzle 21. The ionizer 101 irradiates the processing liquid ejection nozzle 21 with X-rays, so as to generate ions around the processing liquid ejection nozzle 21. The charges of the charged processing liquid ejection nozzle 21 are neutralized by the ions, so that the processing liquid ejection nozzle 21 is destaticized. For example, a transparent resin plate is provided in the bottom surface of the ionizer 101, and X-rays are irradiated through the resin plate.

When the substrate W is not held on the holder 3, the ionizer 101 irradiates the processing liquid ejection nozzle 21 with X-rays to destaticize the processing liquid ejection nozzle 21. That is, when no substrate W exists in the processing container 2, the ionizer 101 irradiates the processing liquid ejection nozzle 21 with X-rays to destaticize the processing liquid ejection nozzle 21.

<Effects>

The substrate processing apparatus 1 includes the processing liquid ejection nozzle 21 and the ionizer 101. The ionizer 101 destaticizes the processing liquid ejection nozzle 21.

As a result, the substrate processing apparatus 1 may suppress the charging of the processing liquid ejection nozzle 21. Thus, the substrate processing apparatus 1 may suppress the generation of particles caused from the charging of the processing liquid ejection nozzle 21.

The ionizer 101 destaticizes the processing liquid ejection nozzle 21 when the substrate W is not held on the holder 3.

As a result, the substrate processing apparatus 1 may prevent the processing liquid from adhering to the substrate W when the processing liquid ejection nozzle 21 is destaticized.

<Modification of Seventh Embodiment>

An ionizer 101 of a substrate processing apparatus 1 according to a modification may internally generate ions, and supply the generated ions to the processing liquid ejection nozzle 21, so as to destaticize the processing liquid ejection nozzle 21. The ionizer 101 supplies the generated ions toward the processing liquid ejection nozzle 21 from a plurality of air holes formed in the bottom surface thereof.

<Modifications>

In a substrate processing apparatus 1 according to a modification, a portion of the movement mechanism 11 may be disposed in the nozzle block 20 or 51, or the arm portion 10. For example, the substrate processing apparatus 1 according to the modification pivots the nozzle block 51 (an example of the fixing member) with respect to the arm portion 10 by the movement mechanism 11 (an example of the pivoting mechanism). As a result, the substrate processing apparatus 1 according to the modification may change the ejection angle of the processing liquid during the substrate processing. Thus, the substrate processing apparatus 1 according to the modification may uniformly eject the processing liquid to the peripheral edge of the substrate W, and may accurately etch the peripheral edge of the substrate W.

Figure 23:
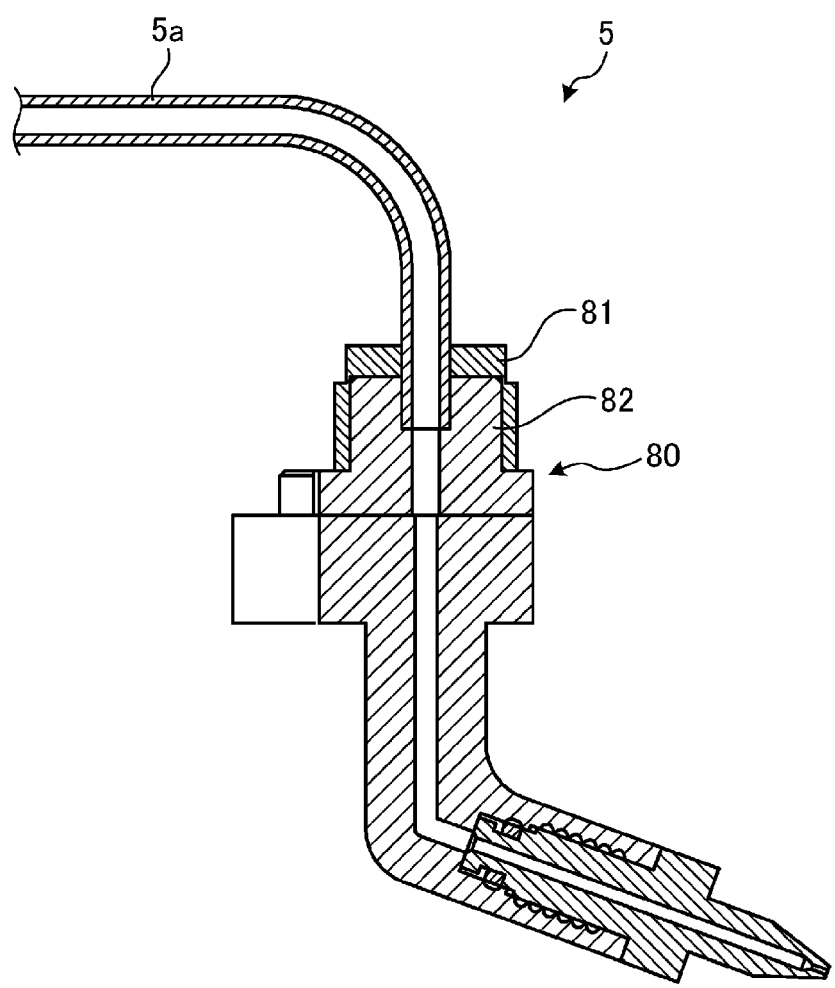
FIG. 23 is a cross-sectional view illustrating a portion of an arm according to a modification.

Further, in a substrate processing apparatus 1 according to a modification, the processing liquid supply path 20a may not be formed in the nozzle block 20 or 51, and the processing liquid supply tube 5a may be directly connected to the processing liquid ejection nozzle 80 as illustrated in FIG. 23. FIG. 23 is a cross-sectional view illustrating a portion of the arm 5 according to the modification. For example, a resin nut 81 is provided at the tip of the processing liquid supply tube 5a. Further, a screw threshold is formed in a first main body 82 of a processing liquid ejection nozzle 80, such that the resin nut 81 may be screwed into the screw thread.

As a result, the configuration of the nozzle block 20 or 51 may be simplified without forming the processing liquid supply path 20a in the nozzle block 20 or 51. Thus, costs may be reduced.

Further, in the processing liquid ejection nozzle 52 according to the modification, the inner wall surfaces 31c and 31e of the nozzle ejection portion 31 may have a higher hydrophilicity than that of the inner wall surface 35c of the first flow path 35a and the inner wall surface 36c of the second flow path 36a. For example, in the processing liquid ejection nozzle 52 according to the modification, a hydrophilic processing may be performed on a portion of the inner wall surfaces 31c and 31e of the ejection flow path 31b that includes the inner wall surface 31e of the ejection port 31d. Further, in the processing liquid ejection nozzle 52 according to the modification, the nozzle main body 30 may be formed of a resin having a relatively high chemical resistance and a relatively high hydrophobicity, and the nozzle ejector 31 may be formed of a material having a higher hydrophilicity than that of the nozzle main body 30.

As a result, bubbles hardly adhere to the ejection port 31d, and are hardly discharged together with the processing liquid when the processing liquid is ejected. Thus, the ejection state of the processing liquid may be stabilized.

Further, in a substrate processing apparatus 1 according to a modification, a substrate alignment mechanism may be provided in the arm 5. The substrate alignment mechanism is provided in each of the left arm 5L and the right arm 5R. The substrate alignment mechanism sandwiches the substrate W therebetween in the horizontal direction, to align the position of the substrate W placed on the holder 3. Specifically, the substrate alignment mechanism adjusts the position of the substrate W, such that the center of the substrate W and the rotation axis of the holder 3 coincide with each other. In the substrate processing apparatus 1 according to the modification, the substrate W that has been subjected to the position alignment by the substrate alignment mechanism is held on the holder 3.

As a result, the substrate processing apparatus 1 according to the modification may accurately etch the peripheral edge of the substrate W.

Further, the substrate processing apparatuses 1 according to the embodiments and the substrate processing apparatuses 1 according to the modifications may be combined with each other. For example, the gas ejection nozzle 71 may be provided in the substrate processing apparatus 1 according to the first embodiment. For example, the processing liquid supply 50 of the second embodiment may be used in the substrate processing apparatuses 1 according to the fourth to seventh embodiments. While an example where the processing liquid ejection nozzles 21, 52, and 80 according to the embodiments etch the peripheral edge of the substrate W has been described, the processing liquid ejection nozzles may be used for etching or cleaning not only the peripheral edge of the substrate W but also the entire surface of the substrate W.

According to the present disclosure, the generation of particles may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing liquid ejection nozzle comprising:
a nozzle main body including a first main body formed with a first flow path therein which communicates with a processing liquid supply path of a nozzle block, and a second main body bent from the first main body and formed with a second flow path therein which communicates with the first flow path; and
a connection portion configured to change an attachment position of the nozzle main body relative to nozzle block so as to change an angle of the nozzle main body in a horizontal direction with respect to the nozzle block to which the nozzle main body is fixed.

2. The processing liquid ejection nozzle according to claim 1, wherein the connection portion pivotably supports the first main body.

3. The processing liquid ejection nozzle according to claim 2, wherein the nozzle main body and the connection portion includes a first alignment groove and a second alignment groove, respectively, to adjust the angle.

4. The processing liquid ejection nozzle according to claim 1, further comprising:
a nozzle ejector formed with an ejection flow path therein which communicates with the second flow path, and configured to eject a processing liquid to a substrate, wherein the nozzle ejector is attachable to and detachable from a tip of the second main body.

5. The processing liquid ejection nozzle according to claim 4, wherein a diameter of the ejection flow path is smaller than a diameter of the second flow path.

6. The processing liquid ejection nozzle according to claim 4, wherein an inner wall surface of the nozzle ejector has a higher hydrophilicity than inner wall surfaces of the first flow path and the second flow path.

7. A substrate processing apparatus comprising:
the processing liquid ejection nozzle according to claim 1;
a first conductive member configured to be electrically conducted with the processing liquid ejection nozzle by coming into contact with the processing liquid ejection nozzle;
a second conductive member configured to be electrically conducted with the first conductive member by coming into contact with the first conductive member, and to destaticize the processing liquid ejection nozzle;
a movement mechanism including an arm portion configured to switch a position of the processing liquid ejection nozzle and a position of the first conductive member between a contact position where the first conductive member and the second conductive member come into contact with each other and a non-contact position where the first conductive member and the second conductive member are not in contact with each other.

8. The substrate processing apparatus according to claim 7, wherein at least one of the first conductive member and the second conductive member includes a deformable portion configured to be deformed when the at least one of the first conductive member and the second conductive member comes into contact with the other conductive member.

9. The substrate processing apparatus according to claim 7, further comprising:
a holder configured to hold a substrate thereon when the substrate processing is performed; and
a cup provided to surround an outer periphery of the substrate held on the holder,
wherein the second conductive member conductor is provided in the cup.

10. The substrate processing apparatus according to claim 7, further comprising:
a processing container configured to accommodate the processing liquid ejection nozzle and the pivot therein,
wherein the second conductive member is provided in the processing container,
the arm portion moves the processing liquid ejection nozzle and the first conductive member up and down to switch the position of the processing liquid ejection nozzle and the position of the first conductive member between the contact position and the non-contact position.

11. A substrate processing apparatus comprising:
the processing liquid ejection nozzle according to claim 1; and
an arm configured to come into contact with the processing liquid ejection nozzle and to be electrically conducted with the processing liquid ejection nozzle.

12. A substrate processing apparatus comprising:
the processing liquid ejection nozzle according to claim 1; and
an ionizer configured to destaticize the processing liquid ejection nozzle.

13. The substrate processing apparatus according to claim 12, further comprising:

a holder configured to hold a substrate thereon when the substrate processing is performed, wherein the ionizer destaticizes the processing liquid ejection nozzle when the substrate is not held on the holder.

14. A nozzle arm comprising:
the processing liquid ejection nozzle according to claim 1;
the nozzle block;
an arm to which the nozzle block is attached; and
a pivot configured to horizontally pivot the nozzle block or the arm.

15. The nozzle arm according to claim 14, wherein the pivot pivots the nozzle block with respect to the arm.

16. The nozzle arm according to claim 14, further comprising:
a gas ejection nozzle configured to eject a gas for discharging a processing liquid scattered above a substrate after reaching the substrate, to an outside of the substrate.

17. The nozzle arm according to claim 16, wherein the gas ejection nozzle is disposed closer to a center of the substrate than the processing liquid ejection nozzle.

18. The nozzle arm according to claim 16, wherein the gas ejection nozzle ejects the gas at an angle larger than an ejection angle of the processing liquid in a horizontal direction with respect to a tangent line of the substrate.

19. A substrate processing apparatus comprising;
the nozzle arm according to claim 14; and
a substrate rotating stage configured to rotate a substrate placed thereon,
wherein the processing liquid ejection nozzle ejects a processing liquid toward a peripheral edge of the substrate.

20. A substrate processing apparatus comprising:
the nozzle arm according to claim 14;
a substrate rotating stage configured to rotate a substrate placed thereon; and
a controller configured to control the processing liquid ejection nozzle and the substrate rotating stage,
wherein the controller
sets a pivoting angle of the nozzle block or the arm of the nozzle arm of claim 8 according to a substrate processing, and
causes a processing liquid to be ejected toward the substrate at the pivoting angle.

21. The substrate processing apparatus according to claim 20, wherein the controller changes the pivoting angle during the substrate processing.

22. A substrate processing method comprising:
setting a pivoting angle of the nozzle block or the arm of the nozzle arm of claim 14 according to a substrate processing; and
ejecting the processing liquid toward a substrate at the pivoting angle set in the setting using the nozzle arm of claim 14.

* * * * *